(12) United States Patent
Yang et al.

(10) Patent No.: US 11,043,375 B2
(45) Date of Patent: Jun. 22, 2021

(54) PLASMA DEPOSITION OF CARBON HARDMASK

(71) Applicant: Applied Materials, Inc., Santa Clara, CA (US)

(72) Inventors: Yang Yang, San Diego, CA (US); Eswaranand Venkatasubramanian, Santa Clara, CA (US); Kartik Ramaswamy, San Jose, CA (US); Kenneth S. Collins, San Jose, CA (US); Steven Lane, Porterville, CA (US); Gonzalo Monroy, San Francisco, CA (US); Lucy Zhiping Chen, Santa Clara, CA (US); Yue Guo, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/055,974

(22) Filed: Aug. 6, 2018

(65) Prior Publication Data

US 2019/0057862 A1 Feb. 21, 2019

Related U.S. Application Data

(60) Provisional application No. 62/546,266, filed on Aug. 16, 2017.

(51) Int. Cl.
*C23C 16/26* (2006.01)
*C23C 16/505* (2006.01)
(Continued)

(52) U.S. Cl.
CPC .... *H01L 21/02274* (2013.01); *C23C 14/0605* (2013.01); *C23C 14/345* (2013.01);
(Continued)

(58) Field of Classification Search
CPC ............ H01J 37/3233; H01J 37/32568; H01J 37/32458; H01J 37/32724; H01J 37/3266;
(Continued)

(56) References Cited

U.S. PATENT DOCUMENTS 4,783,368 A 11/1988 Yamamoto et al.
5,352,493 A 10/1994 Dorfman et al.
(Continued)

FOREIGN PATENT DOCUMENTS

JP 2010-024476 A 2/2010

OTHER PUBLICATIONS

Ban, Diamond-like carbon films deposited by electron beam excited plasma chemical vapor deposition, 2002, diamnd and related materials, 11, p. 1353-1359 (Year: 2002).*
(Continued)

*Primary Examiner* — Dah-Wei D. Yuan
*Assistant Examiner* — Nga Leung V Law
(74) *Attorney, Agent, or Firm* — Patterson + Sheridan, LLP

(57) ABSTRACT

A method of forming a transparent carbon layer on a substrate is provided. The method comprises generating an electron beam plasma above a surface of a substrate positioned over a first electrode and disposed in a processing chamber having a second electrode positioned above the first electrode. The method further comprises flowing a hydrocarbon-containing gas mixture into the processing chamber, wherein the second electrode has a surface containing a secondary electron emission material selected from a silicon-containing material and a carbon-containing material. The method further comprises applying a first RF power to at least one of the first electrode and the second electrode and forming a transparent carbon layer on the surface of the substrate.

19 Claims, 7 Drawing Sheets

(51) Int. Cl.

| | | |
|---|---|---|
| *C23C 16/52* | (2006.01) | |
| *C23C 16/44* | (2006.01) | |
| *C23C 14/34* | (2006.01) | |
| *C23C 14/06* | (2006.01) | |
| *H01L 21/02* | (2006.01) | |
| *H01J 37/32* | (2006.01) | |
| *H01L 21/3213* | (2006.01) | |
| *H01L 21/033* | (2006.01) | |
| *H01L 21/311* | (2006.01) | |

(52) U.S. Cl.
CPC ......... *C23C 16/26* (2013.01); *C23C 16/4405* (2013.01); *C23C 16/505* (2013.01); *C23C 16/52* (2013.01); *H01J 37/3266* (2013.01); *H01J 37/32458* (2013.01); *H01J 37/32568* (2013.01); *H01J 37/32724* (2013.01); *H01L 21/02115* (2013.01); *H01L 21/02266* (2013.01); *H01L 21/0332* (2013.01); *H01L 21/0337* (2013.01); *H01L 21/31144* (2013.01); *H01L 21/32139* (2013.01); *H01J 2237/3321* (2013.01); *H01J 2237/3341* (2013.01)

(58) Field of Classification Search
CPC ...... H01J 2237/3341; H01J 2237/3321; C23C 16/26; C23C 16/272; C23C 16/4405; C23C 16/505; C23C 16/52; C23C 14/345; C23C 14/0605; H01L 21/02274; H01L 21/02115; H01L 21/0332; H01L 21/02266; H01L 21/32139; H01L 21/0337; H01L 21/31144
See application file for complete search history.

(56) References Cited

U.S. PATENT DOCUMENTS

| | | | |
|---|---|---|---|
| 5,378,316 A | | 1/1995 | Franke et al. |
| 5,942,854 A | * | 8/1999 | Ryoji ................ H01J 37/32009 118/723 HC |
| 6,013,980 A | | 1/2000 | Goel et al. |
| 6,320,295 B1 | | 11/2001 | McGill et al. |
| 6,592,771 B1 | * | 7/2003 | Yamanaka .......... H01L 21/3065 216/63 |
| 6,900,002 B1 | | 5/2005 | Plat et al. |
| 7,942,111 B2 | | 5/2011 | Burger et al. |
| 8,119,240 B2 | | 2/2012 | Cooper |
| 9,269,587 B2 | | 2/2016 | Shimizu et al. |
| 10,249,495 B2 | | 4/2019 | Yang et al. |
| 2006/0246290 A1 | | 11/2006 | Oda et al. |
| 2007/0275569 A1 | | 11/2007 | Moghadam et al. |
| 2008/0085604 A1 | * | 4/2008 | Hoshino ............ H01L 21/3065 438/712 |
| 2008/0194169 A1 | * | 8/2008 | Sterling ............ H01L 21/68757 445/73 |
| 2009/0047760 A1 | * | 2/2009 | Yamazaki ............... H01L 29/04 438/158 |
| 2009/0186206 A1 | | 7/2009 | Ito et al. |
| 2013/0146443 A1 | | 6/2013 | Papa et al. |
| 2014/0345802 A1 | * | 11/2014 | Umehara ................. H05H 1/46 156/345.28 |
| 2016/0042961 A1 | * | 2/2016 | Dorf ................ H01J 37/32715 438/710 |
| 2016/0053366 A1 | | 2/2016 | Stowell et al. |
| 2016/0276134 A1 | | 9/2016 | Collins et al. |
| 2017/0372899 A1 | | 12/2017 | Yang et al. |
| 2019/0228970 A1 | | 7/2019 | Yang et al. |

OTHER PUBLICATIONS

Ban, Stress and structural properties of diamond-line carbon films deposited by electron beam excited plasma CVD, 2003, Diamond and related materials, 12, p. 47-56 (Year: 2003).*

Mousinho, High density plasma chemical vapor deposition of diamond like carbon films, 2003, Microelectronics Journal, 34, p. 627-629 (Year: 2003).*

* cited by examiner

PLASMA DEPOSITION OF CARBON HARDMASK

CROSS-REFERENCE TO RELATED APPLICATIONS

This application claims benefit of U.S. Provisional Patent Application Ser. No. 62/546,266, filed Aug. 16, 2017, which is incorporated herein by reference in its entirety.

BACKGROUND

Field

Implementations of the present disclosure generally relate to the fabrication of integrated circuits. More particularly, the implementations described herein provide techniques for deposition of high-density films for patterning applications.

Description of the Related Art

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, it is now necessary to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer step due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are desirable. As critical dimensions (CD) decrease, current hardmask materials lack the desired etch selectivity relative to underlying materials (e.g., oxides and nitrides) and are often difficult to deposit.

Therefore, there is a need in the art for an improved hardmask layer and methods for depositing improved hardmask layers.

SUMMARY

Implementations of the present disclosure generally relate to the fabrication of integrated circuits. More particularly, the implementations described herein provide techniques for deposition of high-density films for patterning applications. In one implementation, a method of forming a transparent carbon layer on a substrate is provided. The method comprises generating an electron beam plasma above a surface of a substrate positioned over a first electrode and disposed in a processing chamber having a second electrode positioned above the first electrode. The method further comprises flowing a hydrocarbon-containing gas mixture into the processing chamber, wherein the second electrode has a surface containing a secondary electron emission material selected from a silicon-containing material and a carbon-containing material. The method further comprises applying a first RF power to at least one of the first electrode and the second electrode and forming a transparent carbon layer on the surface of the substrate.

In another implementation, a hardmask layer comprising a transparent carbon layer formed by an electron beam plasma process is provided. The transparent carbon layer serves as a hardmask layer in an etching process for use in semiconductor applications.

In yet another implementation, a method of forming a transparent carbon layer is provided. The method comprises bombarding a carbon-containing electrode disposed in a processing chamber to generate a secondary electron beam in a gas mixture containing a hydrocarbon-containing gas above a surface of a substrate disposed in the processing chamber. The method further comprises forming a transparent carbon layer on the surface of the substrate from the hydrocarbon-containing gas of the gas mixture.

In yet another implementation, a method of forming a carbon hardmask layer on a substrate is provided. The method comprises performing a chemical vapor deposition (CVD) process. The CVD process comprises flowing a hydrocarbon-containing gas and a first inert gas into a processing chamber, wherein the processing chamber includes a substrate positioned over a first electrode and a second electrode positioned above a surface of the substrate, the second electrode having a surface containing a carbon-containing material. The CVD process further comprises applying a first RF source power to at least the first electrode and forming a carbon layer on the surface of the substrate. The method further comprises performing a physical vapor deposition (PVD) process, comprising flowing a second inert gas into the processing chamber. The PVD process further comprises applying a second RF power to at least the second electrode and sputtering carbon from the second electrode onto the carbon layer to form the carbon hardmask layer.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are

Figure 1:
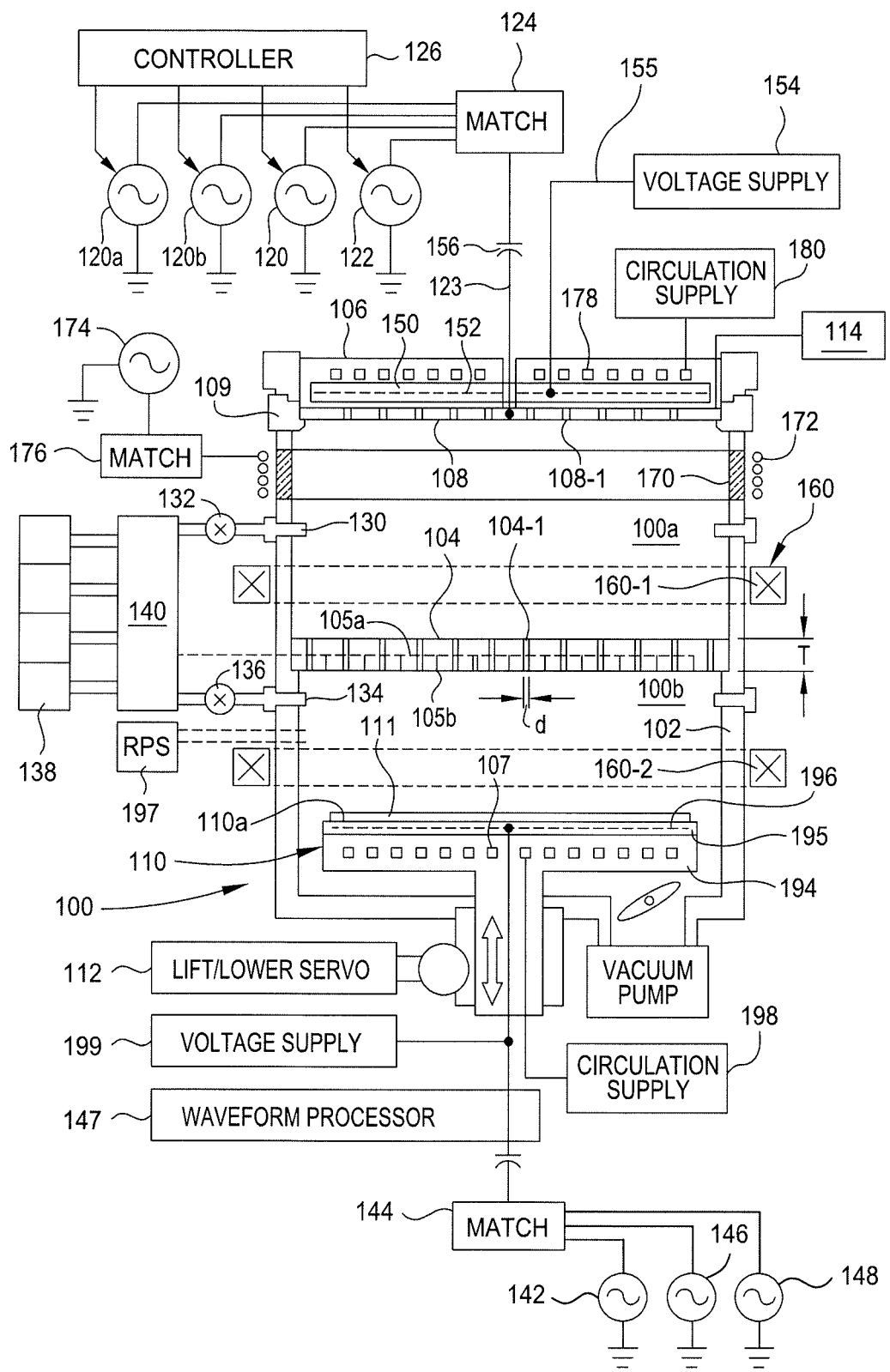
FIG. 1 depicts a schematic illustration of one example of a deposition apparatus in which electron beam plasma technique can be used to practice implementations of the disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes method for forming carbon-containing hardmask layers. Certain details are set forth in the following description and in FIGS. 1-6C to provide a thorough understanding of various implementations of the disclosure. Other details describing well-known structures and systems often associated with chemical vapor deposition and physical vapor deposition are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Ashable hardmask films are used in semiconductor process as etch stop layers. Hardmask materials have high etch resistance compared to the etching of underlayer materials such as dielectric stacks or metal layers. Another aspect for hardmask materials is transparency. As lithography schemes usually employ lasers for mask alignment (for example, 633 nm laser), the hardmask material is typically transparent at the chosen wavelength at the film's full thickness.

The transparency of hardmask materials is usually evaluated by the extinction coefficient (k). The k-value of the state of the art hardmask material typically ranges from 0.2 to 1.0, which limits the maximum thickness of the hardmask film that can be deposited without affecting mask alignment. There is a need in the industry for transparent hardmask films with k-values less than 0.1 with reasonable etch selectivity and low stress. As transparent mask materials allow for thicker masks and film stress increases with thickness, there is a need for transparent hardmask films that have low stress.

Some implementations of the present disclosure provide methods for plasma deposition of ashable hardmask films that are transparent and have low stress. Some of the hardmask films deposited using the methods described herein have a k-value less than 0.1, stress (absolute value) lower than 100 MPa and density between 1.5 to 2 g/cc. The hardmask films described herein may be deposited in a processing chamber having a multiple frequency capacitively coupled plasma (CCP) configuration surrounded by a ceramic wall. Outside the ceramic wall is an inductively coupled coil, which can inductively enhance the plasma as well. The processing chamber has a top electrode, which is powered by one or more RF generators. The top electrode can also function as the gas distribution showerhead. Feedstock gases can also be injected sideways into the processing chamber for modulation of film uniformity. The processing chamber further includes a bottom electrode, where the wafer is positioned. The bottom electrode is also powered by RF generators and the driven frequency is dependent on the selected deposition scheme.

In one implementation of the present disclosure, one or more hydrocarbon feedstock gases (e.g., $CH_4$, $C_2H_2$, $C_2H_4$, $C_3H_6$, $C_4H_{10}$, $C_6H_6$, $C_6H_{12}$, $C_7H_8$, etc.) are introduced into a processing chamber through either a showerhead electrode or a sidewall injection. The processing chamber typically includes a top electrode (e.g., showerhead electrode), a bottom electrode (e.g., pedestal), and an ICP coil which surrounds a portion of the processing chamber. The one or more hydrocarbon feedstock gases may be diluted with an inert gas, such as Ar or He, to increase plasma density. Prior to striking the plasma, a stable operating pressure (e.g., from about 0.1 mTorr to a few Torr) may be established in the processing chamber by a gate valve above the vacuum pump. RF power is applied to at least one of the top electrode, the bottom electrode, and the ICP coil. The top electrode, the bottom electrode, and the ICP coil can be powered simultaneously, or two of the three can be powered simultaneously, depending on the power scheme. The applied RF frequency ranges from a few hundreds of kHz to tens of MHz. Multiple frequencies could also be applied to the top electrode or bottom electrode to optimize ion fluxes and energy incident onto the substrate. After the desired deposition time, power is turned-off and deposition is finished.

The power scheme for the top electrode, the bottom electrode and the ICP coil can be any one of the following power schemes. In one implementation, only the top electrode is powered. The top electrode could be driven by multiple frequencies at the same time (for example, about 2 MHz and about 40 MHz). In this implementation, the deposited film has low k-value and low stress. In another implementation, the top electrode and the ICP are powered. In this implementation, the deposited film has low k-value and low stress as well. ICP can be used as a means to further lower k-value, increase deposition speed or tune uniformity. In yet another implementation, only the bottom electrode is powered. The bottom electrode is either high frequency driven (e.g., frequency higher than 13 MHz, for example, 60 MHz) or high frequency and low frequency driven in this configuration. In some implementations, the bottom electrode and the top electrode are powered simultaneously. In some implementations, the lower electrode and the ICP are powered simultaneously. In implementations where the bottom electrode is powered, the driven frequencies include a high frequency component to enhance the film transparency.

The state of the art feedstock gases for carbon hardmask deposition typically include large hydrocarbon molecules, such as $C_3H_6$. In some implementations of the present disclosure, it is preferable to use $CH_4$ as the feedstock gas instead of $C_2H_2$ or $C_3H_6$ since large molecular gases such as $C_3H_6$ normally increase the film k-value beyond 0.1. In other implementations, common feedstock gases such as $C_3H_6$ and $C_2H_2$ can be used as well as $CH_4$. Feedstock supplies in the liquid form such as norbornadiene can also be used as hydrocarbon sources.

In some implementations, the top electrode has an electrode surface made of a high secondary electron emission material such as silicon or carbon. As the top electrode is bombarded with ions, secondary electrons emitted due to the ion bombardment are accelerated by the plasma sheath thus acquiring high energy. Those energetic secondary electrons shoot downwards like electron beams and are very efficient for ionization and dissociation of hydrocarbon molecules. To increase the collision probability, the gaps between the top electrode and the bottom electrode can be increased.

Apart from dilution gas and hydrocarbon gas, other feedstock gases such as $H_2$, $N_2$, $C_2$, $CF_4$, $NF_3$, $NH_3$ or $CO$ can also be added to extract hydrogen from the deposited film and increase film density.

FIG. 1 depicts a schematic illustration of one example of a processing chamber 100 in which electron beam plasma techniques can be used to practice implementations of the present disclosure. The electron beam plasma chamber has a vacuum chamber body defining the processing chamber 100 including a sidewall 102 of cylindrical shape. The processing chamber 100 is divided by a grid filter 104 into an upper chamber region 100a and a lower chamber region 100b. The lower chamber region 100b is a drift space because of a lack of substantial electric field therein in the absence of an applied bias voltage. A ceiling 106 overlies the upper chamber region 100a and supports an electrode 108. In one implementation, the electrode 108 is formed of a process compatible material such as silicon, carbon, silicon carbon compound, or a silicon-oxide compound. In an alternative implementation, the electrode 108 is formed of a metal oxide such as aluminum oxide, yttrium oxide, or zirconium oxide. The ceiling 106 and the electrode 108 may be disk-shaped. A bottom surface of the electrode 108 faces the grid filter 104 and is exposed to the interior of the upper chamber region 100a. In one implementation, an insulator or dielectric ring 109 surrounds the electrode 108.

In one particular implementation depicted herein, the electrode 108 is formed by a carbon-containing material that may assist in providing carbon sources during a hardmask layer deposition process. Thus, the electrode 108 may be consumed after a number of the hardmask layer deposition processes are performed. The material dislodged from the electrode 108 may assist in forming a carbon hardmask layer with high film density by consumption of the materials bombarded from the electrode 108. Thus, periodical replacement of the electrode 108 may be performed to ensure process reliability and repeatability.

In one implementation depicted herein, the electrode 108 functions as a showerhead assembly for delivering process gases into the processing chamber 100. In some implementations, the electrode 108 has a plurality of openings 108-1 for delivering process gases into the processing chamber 100. Gas is supplied from an array of process gas supplies 114 through an array of valves (not shown).

A workpiece support pedestal 110 for supporting a workpiece, e.g., a substrate 111, in the lower chamber region 100b has a workpiece support surface 110a facing the grid filter 104 and may be movable in the axial direction by a lift servo 112. In one implementation, the workpiece support pedestal 110 includes an insulating puck 195 forming the workpiece support surface 110a, a workpiece electrode 196 inside the insulating puck 195, and a chucking voltage supply 199 connected to the workpiece electrode 196. Additionally, a base layer 194 underlying the insulating puck 195 has internal passages 107 for circulating a thermal medium (e.g., a liquid) from a circulation supply 198. The circulation supply 198 may function as a heat sink or as a heat source.

An RF source power generator 120 having a VHF frequency (e.g., 160 MHz) and a lower frequency RF source power generator 122 having a frequency below the VHF range or below the HF range (e.g., in the MF or LF range, e.g., 2 MHz) are coupled to the electrode 108 through an impedance match 124 via an RF feed conductor 123. The RF source power generators 120, 122 are typically capable of producing an RF signal having a frequency from about 0.4 kHz to about 300 MHz and a power between about 0 Watts and about 10,000 Watts. In one implementation, the impedance match 124 is adapted to provide an impedance match at the different frequencies of the RF source power generators 120 and 122, as well as filtering to isolate the power generators from one another. The output power levels of the RF source power generators 120, 122 are independently controlled by a controller 126. As will be described in detail below, power from the RF source power generators 120, 122 is coupled to the electrode 108. In one implementation, the ceiling 106 is electrically conductive and is in electrical contact with the electrode 108, and the power from the impedance match 124 is conducted through the ceiling 106 to the electrode 108.

In one implementation, the sidewall 102 is formed of metal and is grounded. In one implementation, the surface area of grounded internal surfaces inside the upper chamber region 100a is at least twice the surface area of the electrode 108. In one implementation, the grounded internal surfaces inside the processing chamber 100 may be coated with a process compatible material such as silicon, carbon, silicon carbon compound or a silicon-oxide compound. In an alternative implementation, grounded internal surfaces inside the processing chamber 100 may be coated with a material such as aluminum oxide, yttrium oxide, or zirconium oxide.

In one implementation, the RF source power generator 120 may be replaced by two VHF power generators 120a and 120b that are separately controlled. The VHF power generator 120a has an output frequency in a lower portion (e.g., 30 MHz to 150 MHz) of the VHF band, while the VHF power generator 120b has an output frequency in an upper portion (e.g., 150 MHz to 300 MHz) of the VHF band. The controller 126 may govern plasma ion density by selecting the ratio between the output power levels of the VHF power generators 120a and 120b. With the two VHF power generators 120a and 120b, radial plasma uniformity in the upper chamber region 100a can be controlled by selecting the gap of the upper chamber region 100a (the distance between the electrode 108 and the grid filter 104) such that by itself the lower VHF frequency produces an edge-high radial distribution of plasma ion density in the upper chamber region 100a and by itself the upper VHF frequency produces a center-high radial distribution of plasma ion density. With such a selection, the power levels of the two VHF power generators 120*a*, 120*b* are then set to a ratio at which uniformity of radial distribution of plasma ion density is optimized.

In one implementation, the ceiling 106 is a support for the electrode 108 and includes an insulating layer 150 containing a chucking electrode 152 facing the electrode 108. A DC chucking voltage supply 154 is coupled to the chucking electrode 152 via the feed conductor 155, for electrostatically clamping the electrode 108 to the ceiling 106. A DC blocking capacitor 156 may be connected in series with the output of the impedance match 124. The controller 126 may control the DC chucking voltage supply 154. In one implementation, the RF feed conductor 123 from the impedance match 124 may be connected to the electrode support or ceiling 106 rather than being directly connected to the electrode 108. In such an implementation, RF power from the RF feed conductor 123 may be capacitively coupled from the electrode support to the electrode 108. In one implementation, upper gas injectors 130 provide process gas into the upper chamber region 100*a* through a first valve 132. In one implementation, lower gas injectors 134 provide process gas into the lower chamber region 100*b* through a second valve 136. Gas is supplied from an array of process gas supplies 138 through an array of valves 140, which may include the first and second valves 132 and 136, for example. In one implementation, gas species and gas flow rates into the upper and lower chambers 100*a*, 100*b* are independently controllable. The controller 126 may govern the array of valves 140. In one implementation, an inert gas is supplied into the upper chamber region 100*a* and a process gas is supplied into the lower chamber region 100*b*. A flow rate of the inert gas may be selected to substantially prevent convection or diffusion of gases from the lower chamber region 100*b* into the upper chamber region 100*a*, providing substantial chemical isolation of the upper chamber region 100*a*.

In one implementation, plasma may be produced in the upper chamber region 100*a* by various bulk and surface processes, including energetic ion bombardment of the interior surface of the top electron-emitting electrode 108. The ion bombardment energy of the electrode 108 and the plasma density are functions of both RF source power generators 120 and 122. The ion bombardment energy of the electrode 108 may be substantially controlled by the lower frequency power from the RF source power generator 122 and the plasma density in the upper chamber region 100*a* may be substantially controlled (enhanced) by the VHF power from the RF source power generator 120. Energetic secondary electrons may be emitted from the interior surface of the electrode 108. The flux of energetic electrons from the emitting surface may comprise an electron beam, and may have a direction substantially perpendicular to the interior surface of the electrode 108, and a beam energy of approximately the ion bombardment energy of the electrode 108, which typically can range from about 10 eV to 5000 eV, such as at least greater than 100 eV. The collision cross sections for different processes depend upon the electron energy. At low energies, cross-sections for excitation (and dissociation in molecular gases) are larger than for ionization, while at high energies the reverse is true. The RF power level(s) may be advantageously selected to target various inelastic electron collision processes.

In one implementation, a side window 170 in the sidewall 102 faces the upper chamber region 100*a* and is formed of a material (e.g., quartz or aluminum oxide) through which RF power may be inductively coupled. An inductive coil antenna 172 surrounds the side window 170 and is driven by an optional RF source power generator 174 through an impedance match 176. The RF source power generator 174 to be applied to the inductive coil antenna 172 is controlled at between about 200 watts (W) and about 10 kilowatts. The frequency of the inductively coupled power applied to the inductive coil antenna 172 may be between 2 MHz and about 13 MHz. A remote plasma source 197 may introduce plasma species into the lower chamber region 100*b*. In the implementation having RF source power generator 174 and the inductive coil antenna 172, the plasma density in the upper chamber region 100*a* may be substantially controlled (enhanced) by the RF power from the RF source power generator 174. In one example, the RF source power generator 174 and the inductive coil antenna 172 may assist providing a bombardment power to sputter off materials from the electrode 108, thus assisting lodging materials onto a surface of the substrate 111 disposed on the workpiece support pedestal 110.

In one implementation, the grid filter 104 is of a flat disk shape and may be coaxial with the sidewall 102. The grid filter 104 is formed with an array of plural openings 104-1. In one implementation, the axial thickness T of the grid filter 104 and the diameter, "d", of the plural openings 104-1 are selected to promote flow through the grid filter 104 of energetic directed beam electrons while impeding flow of non-beam (low energy) electrons and plasma ions through the grid filter 104, and the ratio of grid filter hole area to total grid filter area may be maximized. The energetic electron flux (electron beam) may pass through the grid filter 104 to the lower chamber region 100*b* and may produce a plasma by various electron impact processes in the lower chamber region 100*b*.

The plasma produced by the electron beam in the lower chamber region 100*b* may have different characteristics from the plasma in the upper chamber region 100*a*. The grid filter 104 may function as a filter to substantially electrically isolate the upper and lower chambers 100*a*, 100*b* from one another. In one implementation, the grid filter 104 is formed of a conductive or semiconductive material, and may be connected to ground or may be electrically floating. In another implementation, the grid filter 104 is formed of a non-conductive material. In one implementation, the grid filter 104 may be coated with a process compatible material such as silicon, carbon, silicon carbon compound or a silicon-oxide compound. In an alternative implementation, the grid filter 104 may be coated with a material such as aluminum oxide, yttrium oxide, or zirconium oxide. In one implementation, the plasma produced in the upper chamber region 100*a* may have high electron density and/or high electron temperature, and have high-energy ions impinging on the electrode 108.

At least a portion of the electron beam, comprised of the secondary electron flux emitted from the electrode 108 due to energetic ion bombardment of the electrode surface, propagates through the grid filter 104 and into the lower chamber region 100*b*, producing a low electron temperature plasma in the lower chamber region 100*b*, with a plasma density that depends upon beam energy and flux, as well as other factors such as pressure and gas composition. The energetic beam electrons may impinge upon the substrate 111 or the workpiece support pedestal 110 upon leaving the plasma region of the lower chamber region 100*b*. The plasma left behind may readily discharge any resultant surface charge caused by the electron beam flux.

In some implementations where a higher electron beam flux or higher electron beam density is involved, the grid filter 104 may be removed or eliminated, as shown in FIG.

Figure 2:
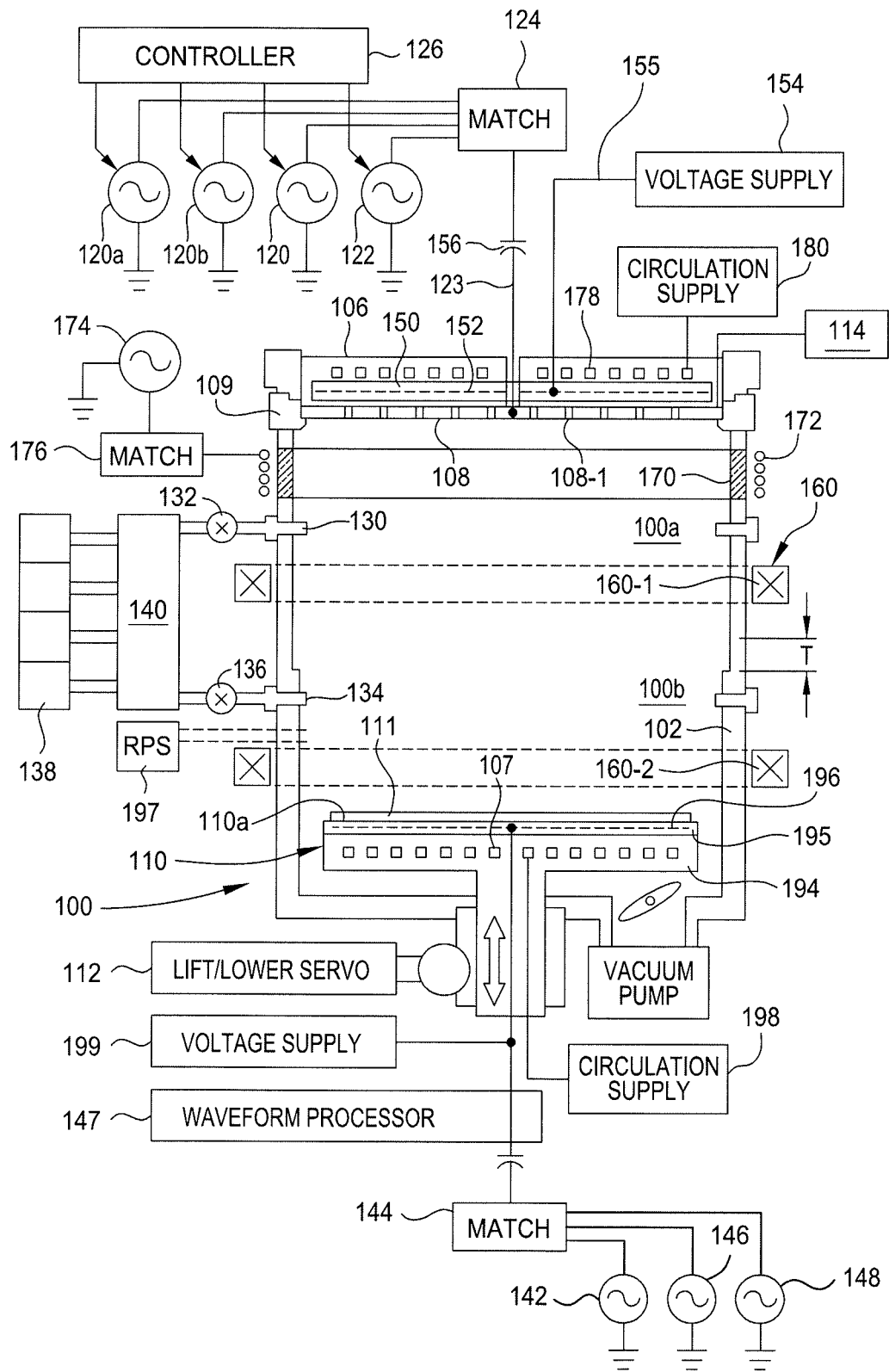
FIG. 2 depicts a schematic illustration of another example of a deposition apparatus in which electron beam plasma technique can be used to practice implementations of the disclosure.

2, to assist the secondary electron beam flux emitted from electrode 108 to reach upon the substrate 111 or the workpiece support pedestal 110 at a faster rate. Alternatively, the grid filter 104 may be removed or eliminated, as shown in FIG. 2, in the processing chamber 100 for any process concerns and requirements.

In one implementation, an electronegative or electron attaching gas such as chlorine is furnished into the chamber, RF and/or VHF power is applied to the electrode 108, RF power is optionally applied to the inductive coil antenna 172, remote plasma source (RPS) power is optionally applied to a remote plasma source (RPS) 197, a plasma is generated in the upper chamber region 100a and an accelerating voltage is developed on the electrode 108 with respect to ground and with respect to the plasma. The resulting energetic ion bombardment of the electrode 108 produces secondary electron emission from electrode surface, which constitutes an electron beam flux from the electrode surface. The grid filter 104 allows at least a portion of the electron beam to propagate through the grid filter 104 and into the lower chamber region 100b, while preventing at least a portion of non-beam electrons and plasma ions from passing through the grid filter 104, producing a low electron temperature plasma in the lower chamber region 100b. The resultant low electron temperature plasma in the lower chamber region 100b in an electronegative gas such as chlorine may produce a highly electronegative plasma, with negative ion densities much higher than electron densities and approaching densities of positive ions. Such a plasma is commonly called an ion-ion plasma.

A substantially axially-directed magnetic field, substantially parallel to the electron beam, may be optionally used to help guide the electron beam, improving beam transport through the upper chamber region 100a, the grid filter 104 and/or the lower chamber region 100b. A low frequency bias voltage or arbitrary waveform of low repetition frequency may be applied to the workpiece support pedestal 110 (e.g., to the workpiece electrode 196) to selectively or alternately extract positive and/or negative ions from said plasma and accelerate those ions at desired energy levels to impact the surface of the substrate 111 for etching, cleaning, deposition, or other materials modification. Radicals produced (a) in the upper chamber region 100a, (b) by the electron beam in the lower chamber region 100b, (c) by the application of bias voltage to the workpiece support pedestal 110, or (d) by the remote plasma source (RPS) 197, may convect or diffuse to the substrate 111 and participate in reaction on the workpiece surface.

In another implementation, a relatively inert gas such as helium or argon is furnished into the upper chamber region 100a, and electronegative or electron-attaching gas, such as sulfur hexafluoride or carbon fluoride or the like, is flowed into the lower chamber region 100b, RF and/or VHF power is applied to the electrode 108, RF power is optionally applied to the inductive coil antenna 172, RPS power is optionally applied to the remote plasma source 197, a plasma is generated in the upper chamber region 100a and an accelerating voltage is developed on the electrode 108 with respect to ground and with respect to the plasma. The resulting energetic ion bombardment of the electrode 108 produces secondary electron emission from electrode surface, which constitutes an electron beam flux from the electrode surface. The grid filter 104 allows at least a portion of the electron beam to propagate through the grid filter 104 and into the lower chamber region 100b, while preventing at least a portion of non-beam electrons and plasma ions from passing through the grid filter 104, producing a low electron temperature plasma in the lower chamber region 100b.

The resultant low electron temperature plasma in the lower plasma chamber in an electronegative gas may produce a highly electronegative plasma, with negative ion densities much higher than electron densities and approaching densities of positive ions, commonly called an ion-ion plasma.

In one implementation, the grid filter 104 is a gas distribution plate, having internal gas passages 105a and gas injection outlets 105b. The internal gas passages 105a may be coupled to the array of valves 140.

In one implementation, an RF bias power generator 142 is coupled through an impedance match 144 to the workpiece electrode 196 of the workpiece support pedestal 110. In a further implementation, a waveform tailoring processor 147 may be connected between the output of the impedance match 144 and the workpiece electrode 196. The waveform tailoring processor 147 changes the waveform produced by the RF bias power generator 142 to a desired waveform. The ion energy of plasma near the substrate 111 is controlled by the waveform tailoring processor 147. In one implementation, the waveform tailoring processor 147 produces a waveform in which the amplitude is held during a certain portion of each RF cycle at a level corresponding to a desired ion energy level. The controller 126 may control the waveform tailoring processor 147.

In one implementation, an RF power generator 146 having a VHF or HF frequency (e.g., 11 MHZ to 60 MHz) and an RF power generator 148 having a frequency below the VHF range or below the HF range (e.g., in the MF or LF range, e.g., 0.4 kHZ to 10 MHz) are coupled to the workpiece electrode 196 through the impedance match 144. The RF power generators 146, 148 are typically capable of producing an RF signal having a frequency from about 0.4 kHz to about 300 MHz and a power between about 0 Watts and about 10,000 Watts. In one implementation, the RF power generators 146, 148 are RF bias power generators. In another implementation, the RF power generators 146, 148 are RF source power generators. In one implementation, the impedance match 124 is adapted to provide an impedance match at the different frequencies of the RF power generators 146 and 148, as well as filtering to isolate the power generators from one another. The output power levels of the RF power generators 146, 148 are independently controlled by the controller 126. As will be described herein, power from the RF power generators 146, 148 is coupled to the workpiece electrode 196. As previously discussed VHF generators may be used.

In one implementation, a magnet 160 surrounds the processing chamber 100. In one implementation, the magnet comprises a pair of magnets 160-1, 160-2 adjacent the upper and lower chambers 100a, 100b, respectively. In one implementation, the pair of magnets 160-1, 160-2 provides an axial magnetic field suitable for confining an electron beam that is propagating from the upper chamber region 100a to the lower chamber region 100b.

In one implementation, flow of energetic electrons to the substrate 111 is blocked by a magnetic field having a predominantly radial component (i.e., transverse to the electron beam flow direction) in the region between the grid filter 104 and the substrate 111. This magnetic field may be produced by one of the magnets 160-1 or 160-2, or by another magnet or set of magnets.

In one implementation, the ceiling 106 includes internal passages 178 for conducting a thermally conductive liquid or media inside the ceiling 106. The internal passages 178 are connected to a thermal media circulation supply 180. The thermal media circulation supply 180 acts as a heat sink or a heat source. The mechanical contact between the electrode 108 and the ceiling 106 is sufficient to maintain high thermal conductance between the electrode 108 and the ceiling 106. In the implementation of FIG. 1, the force of the mechanical contact is regulated by the electrostatic clamping force provided by the DC chucking voltage supply 154.

Transparent Carbon Hardmask

Figure 3:
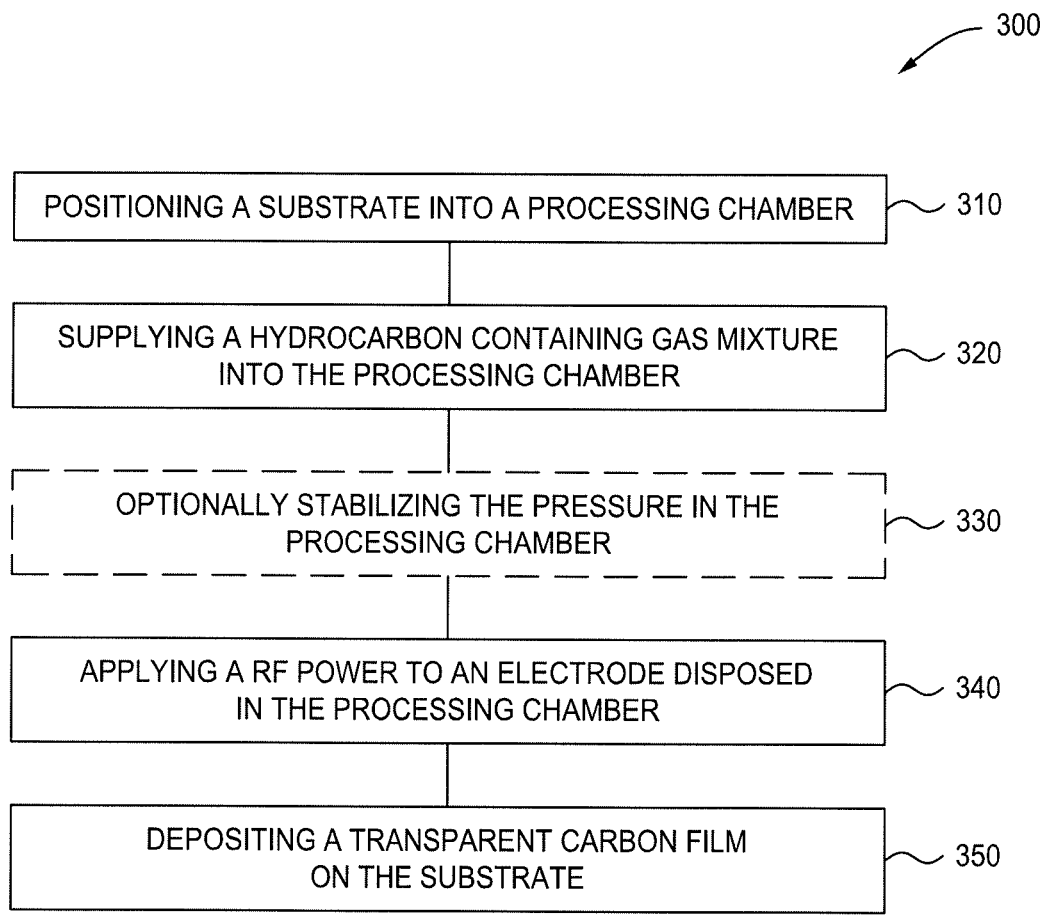
FIG. 3 depicts a flow process diagram of one implementation of a method for forming a transparent carbon hardmask film according to implementations described herein.
Figure 4A:
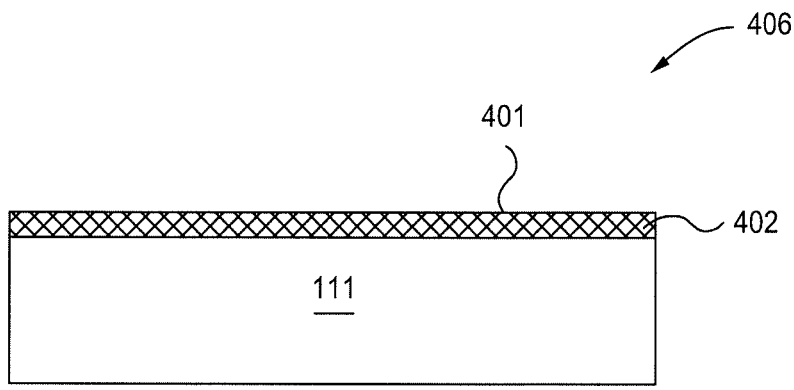
FIGS. 4A-4B depict a sequence of schematic cross-sectional views of a substrate structure incorporating a transparent carbon hardmask film formed on a substrate according to the method of FIG. 3.
Figure 4B:
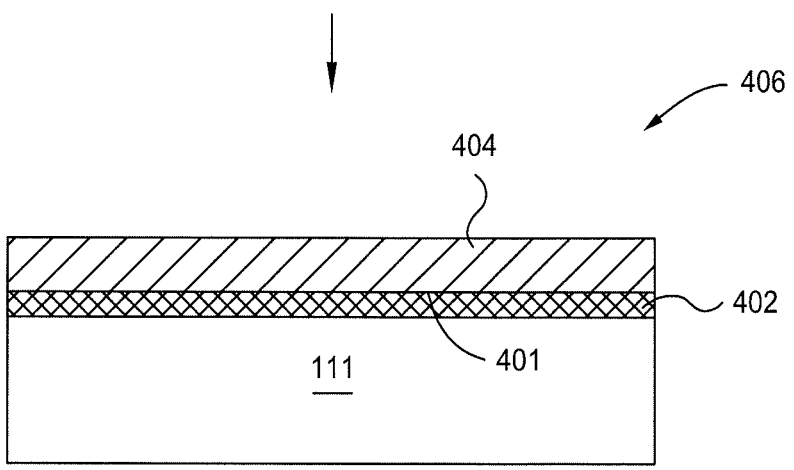

FIG. 3 depicts a flow process diagram of one implementation of a method 300 for forming a transparent carbon layer according to implementations described herein. FIGS. 4A-4B are schematic cross-sectional view illustrating a sequence for forming a transparent carbon layer for use as a hardmask on a substrate structure 406 according to the method 300.

The method 300 begins at operation 310 by providing a substrate 111 having a material layer 402 disposed thereon, as shown in FIG. 4A, into a processing chamber, such as the processing chamber 100 depicted in FIG. 1 or 2. The substrate 111 may have a substantially planar surface, an uneven surface, or a structure formed thereon. In one implementation, the material layer 402 may be a part of a film stack utilized to form a gate structure, a contact structure, an interconnection structure or shallow trench isolation (STI) structure in the front end or back end processes for logic or memory devices, such as NAND structures. In implementations wherein the material layer 402 is not present, the method 300 be directly formed in the substrate 111.

In one implementation, the material layer 402 may be a film stack including repeating layers of silicon oxide and/or silicon nitride layers utilized to form a gate structure for NAND structures. Alternatively, the material layer 402 may be a silicon material utilized to form a gate electrode. In yet another implementation, the material layer 402 may include a silicon oxide layer, a silicon oxide layer deposited over a silicon layer. In yet another implementation, the material layer 402 may include one or more layers of other dielectric materials utilized to fabricate semiconductor devices. Suitable examples of the dielectric layers include silicon oxide, silicon nitride, silicon oxynitride, silicon carbide, or any suitable low-k or porous dielectric material as needed. In still another implementation, the material layer 402 does not include any metal layers.

At operation 320, a hydrocarbon-containing gas mixture is supplied into the processing chamber 100 in preparation for forming a transparent carbon layer 404 on the substrate 111, as shown in FIG. 4B. The gas mixture may be supplied from the process gas supplies 138 through the array of valves 140 to the upper gas injectors 130, 134 respectively flowing into the processing chamber 100.

The hydrocarbon-containing gas mixture includes at least a hydrocarbon compound and an inert gas. In one implementation, hydrocarbon compound has a formula $C_xH_y$, where x has a range between 1 and 12 and y has a range of between 4 and 26. More specifically, aliphatic hydrocarbons include, for example, alkanes such as methane ($CH_4$), ethane ($C_2H_6$), propane ($C_3H_8$), butane ($C_4H_{10}$), pentane ($C_5H_{12}$), hexane ($C_6H_{14}$), heptane, octane, nonane, decane and the like; alkenes such as propene, ethylene, propylene ($C_3H_6$), butylene ($C_4H_8$), pentene, and the like; dienes such as hexadiene butadiene, isoprene, pentadiene and the like; alkynes such as acetylene, vinylacetylene and the like. Alicyclic hydrocarbons include, for example, cyclopropane, cyclobutane, cyclopentane, cyclopentadiene, toluene and the like. Aromatic hydrocarbons include, for example, benzene, styrene, toluene, xylene, pyridine, ethylbenzene, acetophenone, methyl benzoate, phenyl acetate, phenol, cresol, furan, and the like. Additionally, alpha-terpinene, cymene, 1,1,3,3,-tetramethylbutylbenzene, t-butylether, t-butylethylene, methyl-methacrylate, and t-butylfurfurylether may be utilized. Additionally, alpha-terpinene, cymene, 1,1,3,3,-tetramethylbutylbenzene, t-butylether, t-butylethylene, methyl-methacrylate, and t-butylfurfurylether may be selected. In an exemplary implementation, the hydrocarbon compounds are propene, acetylene, ethylene, propylene, butylenes, toluene, and alpha-terpinene. In another exemplary implementation, the hydrocarbon compound is selected from $C_2H_2$, $C_3H_6$, $CH_4$, $C_4H_8$, 1,3-dimethyladamantane, bicyclo[2.2.1]hepta-2,5-diene (2,5-Norbornadiene), adamantine ($O_{10}H_{16}$), norbornene ($C_7H_{10}$), or combinations thereof.

Alternatively, one or more additional hydrocarbon compounds may be mixed with the hydrocarbon compound present in the gas mixture supplied to the process chamber. A mixture of two or more hydrocarbon compounds may be used to deposit the transparent carbon layer.

In a particular implementation, the hydrocarbon compound includes methane ($CH_4$). In another implementation, the hydrocarbon compound includes methane ($CH_4$) and at least one of propene ($C_3H_6$), acetylene ($C_2H_2$) or ethylene ($C_2H_4$).

The inert gas, such as argon (Ar) or helium (He), is supplied with the gas mixture into the processing chamber 100. Other carrier gases, such as nitrogen ($N_2$), oxygen gas ($O_2$), carbon oxide (CO), nitric oxide (NO), hydrogen ($H_2$), ammonia ($NH_3$), a mixture of hydrogen ($H_2$) and nitrogen ($N_2$), or combinations thereof may also be used to control the density and deposition rate of the transparent carbon layer, as necessary. The addition of hydrogen or nitrogen may be used to control the hydrogen ratio (e.g., carbon to hydrogen ratio) of the deposited transparent carbon layer. The hydrogen ratio present in the transparent carbon layer provides control over layer properties, such as reflectivity, transparency and density.

In one implementation, an inert gas, such as argon (Ar) or helium (He) gas, is supplied with the hydrocarbon compound, such as methane ($CH_4$), into the process chamber to deposit the transparent carbon layer. The inert gas provided in the gas mixture may assist control of the optical and mechanical properties of the as-deposited layer, such as the index of refraction (n) and the absorption coefficient (k), hardness, density and elastic modulus of the transparent carbon layer 404.

In one implementation, the hydrocarbon compound, such as methane ($CH_4$), may be supplied in the gas mixture at a rate between about 50 sccm and about 1000 sccm. The inert gas, such as Ar or He gas, may be supplied in the gas mixture at a rate between about 10 sccm and about 1000 sccm. A hydrogen gas ($H_2$) may be supplied in the gas mixture at a rate between about 100 sccm and about 500 sccm. An oxygen gas ($O_2$) may be supplied in the gas mixture at a rate between about 0 sccm and about 200 sccm. A nitrogen gas ($N_2$) may be supplied in the gas mixture at a rate between about 0 sccm and about 400 sccm. Also, the at least one of the propene ($C_3H_6$), acetylene ($C_2H_2$) or ethylene ($C_2H_4$) may be supplied into the gas mixture at a flow rate at between about 100 sccm and about 2000 sccm.

In one example, adjustable flow ratio and species may be controlled and supplied from different locations, such as upper or lower gas injectors 130, 134, and the electrode to the processing chamber 100 to maximize radical dissociation and plasma density below or above the grid filter 104. For example, if a higher plasma density is desired in the upper chamber region 100a to increase beam electron flux, an inert gas, such as Ar or He, may be supplied through the upper gas injector 130, which may promote electrode bombardment and reduce molecule gas density near the electrode 108 to increase local plasma density and beam electron flux. In contrast, when dissociation of hydrogen molecules is desired (e.g., increasing resultant film purity), a hydrogen-containing gas may be supplied through the upper gas injector 130 so as to lower local plasma density but promote hydrogen radical formation to drive out impurities in the processing chamber as well as in the resultant transparent carbon layer 404.

Optionally, at operation 330, the pressure in the processing chamber 100 is stabilized for a predefined RF-on delay time period. The predefined RF-on delay time period is a fixed time delay defined as the time period between introduction of the hydrocarbon-containing gas mixture into the processing chamber 100 and striking or generating the plasma during operation 340. Any suitable fixed time delay may be used to achieve desired conditions. The length of the RF-on delay time period is typically selected such that the hydrocarbon-containing gas mixture does not begin to thermally decompose or substantially thermally decompose in the processing chamber 100. The process of operation 330 may be performed simultaneously, sequentially or may partially overlap with the processes of operation 320 and operation 340.

In such an implementation, the hydrocarbon-containing gas mixture may be introduced into the processing chamber 100 for a longer time such as between about 5 seconds and about 30 seconds, for example about 15 seconds, which may vary depending upon the size of the substrate. The flowing of the hydrocarbon-containing gas mixture prior to striking plasma is believed to provide continuous thermal and pressure stabilization of the processing chamber 100. In one implementation, the hydrocarbon-containing gas mixture is then flowing into the processing chamber 100 about 0.5 seconds to about 5 seconds, for example about 1 second to about 2 seconds (the flowing time may vary as long as the flow is just long enough for the hydrocarbon-containing gas mixture to start reaching the interior volume of the processing chamber 100) prior to striking the RF plasma in operation 340.

At operation 340, after the hydrocarbon-containing gas mixture is supplied into the processing chamber, RF power is supplied to at least one of an upper electrode (e.g., electrode 108), a lower electrode (e.g., workpiece electrode 196), and/or an inductive coil antenna (e.g., the inductive coil antenna 172). At operation 340, after the gas mixture is supplied into the processing chamber, a first RF source power may be generated from the RF source power generators 120, 122, and applied to the electrode 108, to generate plasma and secondary electron beams. Secondary electron beams from the electrode 108 may generate cold plasma, such as a temperature less than 100 degrees Celsius that irradiates a surface 401 of the material layer 402 to form the transparent carbon layer 404 thereon. Additionally, a second optional RF power may also be applied to the inductive coil antenna 172 through the RF source power generator 174 to add inductively coupled power. The inductively coupled power as generated may increase the radical flux to the substrate and increases the ion flux incident (or beam flux) on the electrons in the upper chamber region 100a to produce high density of beam electrons. Inductively coupled power also lowers the sheath voltage on the electrode 108, thus reducing beam energy. Furthermore, a third optional RF power may be applied to the workpiece electrode 196 to optimize ion fluxes and energy incident onto the substrate. The third RF power may be generated by RF power generators 146, 148 and/or additional RF bias power generator 142.

A second source power (e.g., an inductively coupled power) generated from the RF source power generator 174 to be applied to the inductive coil antenna 172 is typically controlled at between about 1 kilowatt and about 10 kilowatts. The frequency of the inductively coupled power applied to the inductive coil antenna 172 may be between 2 MHz and about 13 MHz. In some implementations, the inductively coupled power may be eliminated and optionally applied as needed. A process pressure, for example between 20 mTorr and about 20 Torr, may also be utilized to form the transparent carbon layer 404. It is believed that the electron beam plasma along with the secondary electron beams utilized during the deposition process may provide higher ion bombardment that may enhance dissociation of the ions and energy of the electron beams from the gas mixture, to form the transparent carbon layer 404 with a robust film structure.

In one example, only the upper electrode (e.g., electrode 108) is powered during operation 340. For example, a first RF source power generated from at least one of the RF source power generators 120, 120a, 120b, 122 is applied to the electrode 108 and controlled at a range of between 1 Kilowatts and about 10 Kilowatts. It is noted that the frequency of the RF source power generators 120, 120a, 120b, 122 may be between 0.4 MHz and about 300 MHz. In this example, power is only applied to the upper electrode (e.g., power is not applied to either the lower electrode (e.g., workpiece electrode 196) or the inductive coil antenna (e.g., the inductive coil antenna 172)). In one implementation, the frequency applied to the upper electrode is between 0.4 MHz and about 300 MHz. In one implementation, a high frequency (e.g., between about 11 MHZ and 60 MHz) is applied to the upper electrode. In one implementation, a low frequency (e.g., between about 0.4 kHz and 10 MHz) is applied to the upper electrode. In one implementation, multiple frequencies are applied to the upper electrode (e.g., 2 MHz from low frequency RF source power generator 122 and 40 MHz from VHF power generator 120a). In some implementations, it is preferable to use small molecule hydrocarbon gases (e.g., $CH_4$) while powering the upper electrode since under some conditions, large molecule hydrocarbons have been found to increase the k-value of the deposited transparent carbon film. In this example, the deposited transparent carbon layer has a low k-value and low stress.

In another example, both the upper electrode (e.g., electrode 108) and the inductive coil antenna (e.g., inductive coil antenna 172) are powered during operation 340. For example, a first RF source power generated from at least one of the RF source power generators 120, 120a, 120b, 122 is applied to the upper electrode and controlled at a range of between 1 Kilowatts and about 10 Kilowatts and a second RF source power is applied to the inductive coil antenna and controlled at between about 1 kilowatts and about 10 kilowatts. In this example, power is applied to both the upper electrode and the inductive coil antenna (e.g., power is not applied to the lower electrode (e.g., workpiece electrode 196)). In one implementation, the frequency applied to the upper electrode is between about 0.4 MHz and about 300 MHz and the frequency applied to the inductive coil antenna is between about 2 MHz and about 13 MHz. In one implementation, a high frequency (e.g., between about 11 MHZ and 60 MHz) is applied to the upper electrode and the frequency applied to the inductive coil antenna is between about 2 MHz and about 13 MHz. In one implementation, a low frequency (e.g., between about 0.4 kHz and 10 MHz) is applied to the upper electrode and the frequency applied to the inductive coil antenna is between about 2 MHz and about 13 MHz. In one implementation, multiple frequencies are applied to the upper electrode (e.g., 2 MHz from low frequency RF source power generator 122 and 40 MHz from VHF power generator 120a) and the frequency applied to the inductive coil antenna is between about 2 MHz and about 13 MHz. In some implementations, it is preferable to use small molecule hydrocarbon gases (e.g., $CH_4$) since under some conditions, large molecule hydrocarbons have been found to increase the k-value of the deposited transparent carbon film. In this example, the deposited transparent carbon film has low-k-value and low stress. Not to be bound by theory, but it is believed that the ICP can be used to further lower the k-value, increase deposition speed and tune uniformity.

In yet another example, only the lower electrode (e.g., workpiece electrode 196) is powered during operation 340. In implementations where the lower electrode is powered, the driven frequencies include a high frequency component to enhance film transparency. For example, a first RF power (bias or source) generated from at least one of the RF power generators 146, 148 and/or additional RF bias power generator 142 is applied to the lower electrode and controlled at a range of between 1 Kilowatts and about 10 Kilowatts. It is noted that the frequency of the RF power generators 146, 148 and RF bias power generator 142 may be between 0.4 MHz and about 300 MHz. In this example, power is only applied to the lower electrode (e.g., power is not applied to either the upper electrode (e.g., electrode 108) or the inductive coil antenna (e.g., the inductive coil antenna 172)). In one implementation, the frequency applied to the lower electrode is between 0.4 MHz and about 300 MHz. In one implementation, a high frequency (e.g., between about 11 MHZ and 60 MHz) is applied to the lower electrode. In one implementation, multiple frequencies are applied to the lower electrode (e.g., 2 MHz from RF power generator 148 and 40 MHz from RF power generator 146). Small molecule hydrocarbon gases (e.g., $CH_4$) and larger molecule hydrocarbon gases (e.g., $C_3H_6$ and $C_2H_2$) may be used while powering the lower electrode.

In yet another example, both the upper electrode (e.g., electrode 108) and the lower electrode (e.g., workpiece electrode 196) are powered simultaneously during operation 340 using any of the conditions previously described. For example, an RF source power generated from at least one of the RF source power generators 120, 120a, 120b, 122 is applied to the upper electrode and controlled at a range of between 1 Kilowatts and about 10 Kilowatts and a second RF power (bias or source) is applied to the workpiece electrode 196 and controlled at between about 1 Kilowatts and about 10 Kilowatts. In this example, power is applied to both the electrode 108 and the workpiece electrode 196 (e.g., power is not applied to the inductive coil antenna (e.g., inductive coil antenna 172)). In one implementation, the frequency applied to the electrode 108 is between about 0.4 MHz and about 300 MHz and the frequency applied to the workpiece electrode 196 is between about 0.4 MHz and about 300 MHz. In one implementation, multiple frequencies are applied to the electrode 108 and the workpiece electrode 196 (e.g., 2 MHz from a low frequency RF power generator and 40 MHz from a VHF power generator). Small molecule hydrocarbon gases (e.g., $CH_4$) and larger molecule hydrocarbon gases (e.g., $C_3H_6$ and $C_2H_2$) may be used while powering the lower electrode.

In yet another example, both the inductive coil antenna (e.g., inductive coil antenna 172) and the lower electrode (e.g., workpiece electrode 196) are powered during operation 340. In this example, power is applied to both the inductive coil antenna 172 and the workpiece electrode 196 (e.g., power is not applied to the upper electrode (e.g., electrode 108)). In one implementation, the frequency applied to the inductive coil antenna 172 is between about 2 MHz and about 13 MHz and controlled at a range of between 1 Kilowatts and about 10 Kilowatts and the frequency applied to the workpiece electrode 196 is between about 0.4 MHz and about 300 MHz and controlled at between about 1 Kilowatts and about 10 Kilowatts. In another implementation, multiple frequencies are applied to at least one of the inductive coil antenna 172 and the workpiece electrode 196 (e.g., 2 MHz from a low frequency RF power generator and 40 MHz from a VHF power generator). Small molecule hydrocarbon gases (e.g., $CH_4$) and larger molecule hydrocarbon gases (e.g., $C_3H_6$ and $C_2H_2$) may be used while powering the lower electrode.

In yet another example, the upper electrode (e.g., electrode 108), the lower electrode (e.g., workpiece electrode 196), and the inductive coil antenna (e.g., inductive coil antenna 172) are powered during operation 340. Small molecule hydrocarbon gases (e.g., $CH_4$) and larger molecule hydrocarbon gases (e.g., $C_3H_6$ and $C_2H_2$) may be used while powering the lower electrode.

During operation 340, the substrate temperature may be controlled between room temperature (e.g., 20 degrees Celsius) and about 1000 degrees Celsius. During operation 340, the spacing between the substrate and showerhead may be controlled at about 1000 mils to about 15000 mils. During operation 340, a process pressure may be maintained at, for example, between 0.1 mTorr and about 20 Torr.

At operation 350, after the deposition process is performed by the process parameters regulated at operation 340, the transparent carbon layer 404 is then formed on the substrate 111. In one implementation, the transparent carbon layer 404 as formed herein is configured to have a density between about 1.5 g/cc to about 2.0 g/cc. In one implementation, the transparent carbon layer 404 has a stress of 100 MPa or less. In one implementation, the absorption coefficient (k) of the transparent carbon layer 404 may be controlled at less than 0.3 (e.g., less than 0.1) such as between about 0.01 and about 0.1 at a wavelength about 633 nm. The transparent carbon layer 404 may have a thickness between about 10 nm and about 2,000 nm (e.g., between about 500 and about 1,000 nm; or between about 1,000 nm and about 2,000 nm).

PVD/CVD Carbon Hardmask

Carbon hardmasks are used as etching mask layers in semiconductor manufacture industry. Hardmask layers are often used in relatively high aspect ratio etch applications, where the photoresist layer may not be thick enough to mask the underlying layer. Good hardmask films typically have the following characteristics: high etch selectivity with regard to the underneath to-be-etched layer, high hardness, low global and local stress, high surface smoothness and high transparency. If a hardmask film has high etch selectivity, then the thickness can be reduced thus improving stress and transparency. Etch selectivity is normally proportional to the film density. Most carbon hardmasks are conventionally deposited in CVD reactors. The density of state-of-the-art CVD carbon hardmask films typically ranges from 1.5 g/cc to 2.2 g/cc. Increasing the carbon film density beyond 2.2 g/cc is extremely challenging. Physical vapor deposition (PVD) has also been developed for carbon film deposition. In a PVD process, a carbon target is bombarded by high-energy inert gas ions and sputtered carbon atoms are deposited on the wafer surface to form the hardmask layer. The PVD carbon films typically have a higher density than CVD carbon as there is no hydrogen content in the PVD film. However, PVD carbon films suffer from deficiencies including particle contamination.

Implementations of the present disclosure include methods for depositing high-density carbon hardmask layers using a combination of plasma induced CVD and physical vapor deposition (PVD). The deposited carbon film density, hardness and stress can be modulated by the relative weight of the CVD component and the PVD component.

With reference to FIG. 1 and FIG. 2, the top electrode (e.g., electrode 108) is driven by one or more RF generators and optionally serves as the gas distribution showerhead. The surface of the top electrode includes a carbon portion and as the plasma sheath accelerates ions, carbon atoms are sputtered and deposited on the wafer surface during the PVD component. The bottom electrode (e.g., workpiece electrode 196) is also powered by RF generators. If the feedstock gases contain hydrocarbon gases, any RF power applied to the top electrode and/or the bottom electrode will dissociate the hydrocarbon gases therefore producing the CVD component. One advantage of adding bias RF power for the CVD component is that hydrocarbon ions can be accelerated to the wafer surface and implanted into the carbon layer to increase the carbon film density and hardness. Strong ion bombardment also helps reduce the film stress and creates cross-linking between the PVD layer and the CVD layer thus improving the film morphology. However, if only the top electrode RF power is present, the deposited film is usually soft and low in density.

In one implementation of the present disclosure, one or more hydrocarbon feedstock gases (e.g., $CH_4$, $C_2H_2$, $C_2H_4$, $C_3H_6$, $C_4H_{10}$, $C_6H_6$, $C_6H_{12}$, $C_7H_8$, etc.) are introduced into a processing chamber through either a showerhead electrode or a sidewall injection. The one or more hydrocarbon feedstock gases may be diluted with an inert gas, such as Ar or He, to increase plasma density. Prior to striking the plasma, a stable operating pressure (e.g., from about 0.1 mTorr to a few Torr) may be established in the processing chamber by a gate valve above the vacuum pump. RF power is applied to at least one of the top electrode, the bottom electrode, and the ICP coil. The top electrode, the bottom electrode, and the ICP coil can be powered simultaneously, or two of the three can be powered simultaneously, depending on the power scheme as previously described herein. The applied RF frequency ranges from a few hundreds of kHz to tens of MHz. Multiple frequencies could also be applied to the top electrode or bottom electrode to optimize ion fluxes and energy incident onto the substrate.

After the desired CVD deposition time, the hydrocarbon gases may be stopped and the inert gases continue to flow into the chamber. A stable operating pressure (0.1 mTorr to a few tens of mTorr) may be established by a gate valve above the vacuum pump. Typically, the PVD process pressure is extremely low (e.g., between about 1 mTorr and about 10 mTorr) to maximize ion energy. RF power may be applied to the upper electrode and the lower electrode during PVD deposition. During PVD deposition, the bottom RF power could be absent. The top electrode can be powered by multiple RF frequency sources to maximize the sputtering yield. A magnetic field can be used to further enhance plasma density at low pressure thus increasing the sputtering rate of the carbon. The bottom electrode can be powered to introduce moderate ion bombardment to densify the film and crosslink the PVD and CVD layer. In the RF sputtering regime, the deposited film typically does not have the particle issue. The PVD and CVD processes iteratively run until desired thickness of the hardmask film is deposited. The sequence of deposition, PVD followed by CVD or CVD followed by PVD can be used.

In another implementation, the PVD and CVD processes are performed simultaneously. In this implementation, the CVD film could deposit on the carbon target surface on the top electrode as well, thus hindering the sputtering process. In some implementations, an inert purge gas flows either through the top electrode or is peripherally injected into the upper portion of the chamber (e.g., upper chamber region 100*a*), and carbon source gases are injected into the lower portion of the chamber (lower chamber region 100*b*). In doing so, the back diffusion of carbon source gases to the top electrode is minimized, thus reducing carbon film deposition on the top electrode surface.

In some implementations, during the CVD process, the powered top electrode also emits secondary electrons due to ion bombardment. The secondary electrons are accelerated by the plasma sheath and have energies on the order of hundreds of eV to keV. As the electron impact ionization cross-section of hydrocarbon gases usually peaks at hundreds of eV, the secondary electrons could significantly contribute to hydrocarbon gas ionization thus contributing to the increase in film density. Therefore, multiple RF frequencies can be applied to the upper electrode to optimize the secondary electron emission yield while keeping the sheath voltage around hundreds of eV.

An oxygen plasma cleaning process may be performed between the CVD and the PVD step to remove deposited film from the surface of the upper electrode, which may be deposited during the CVD process. In doing so, the sputtering process begins with a clean carbon surface. The oxygen plasma may be formed by flowing an oxygen-containing gas and optionally in inert gas into the processing chamber. The oxygen-containing gas may be selected from the group consisting of: $N_2O$, $C_2$, $C_3$, $H_2O$, and combinations thereof. The optional inert gas may be selected from the group consisting of: helium, argon, and combinations thereof. During the oxygen plasma cleaning process, RF power is supplied to at least one of the upper electrode (e.g., electrode 108) and/or the inductive coil antenna (e.g., the inductive coil antenna 172).

In some implementations of the oxygen plasma cleaning process, RF power generated from at least one of the RF source power generators 120, 120*a*, 120*b*, 122 is applied to the electrode 108 and controlled at a range of between 1 Kilowatts and about 10 Kilowatts. It is noted that the frequency of the RF source power generators 120, 120*a*, 120*b*, 122 may be between 0.4 MHz and about 300 MHz. In some implementations where a second RF source power is used, the second RF source power (e.g., an inductively coupled power) is generated from the RF source power generator 174 to be applied to the inductive coil antenna 172 and is typically controlled at between about 1 Kilowatt and about 10 Kilowatts. The frequency of the inductively coupled power applied to the inductive coil antenna 172 may be between 2 MHz and about 13 MHz. A process pressure, for example between 20 mTorr and about 20 Torr, may also be utilized to perform the oxygen plasma cleaning process. The oxygen plasma cleaning process may be performed for a time period sufficient to remove residue from the surface of the electrode 108.

Figure 5A:
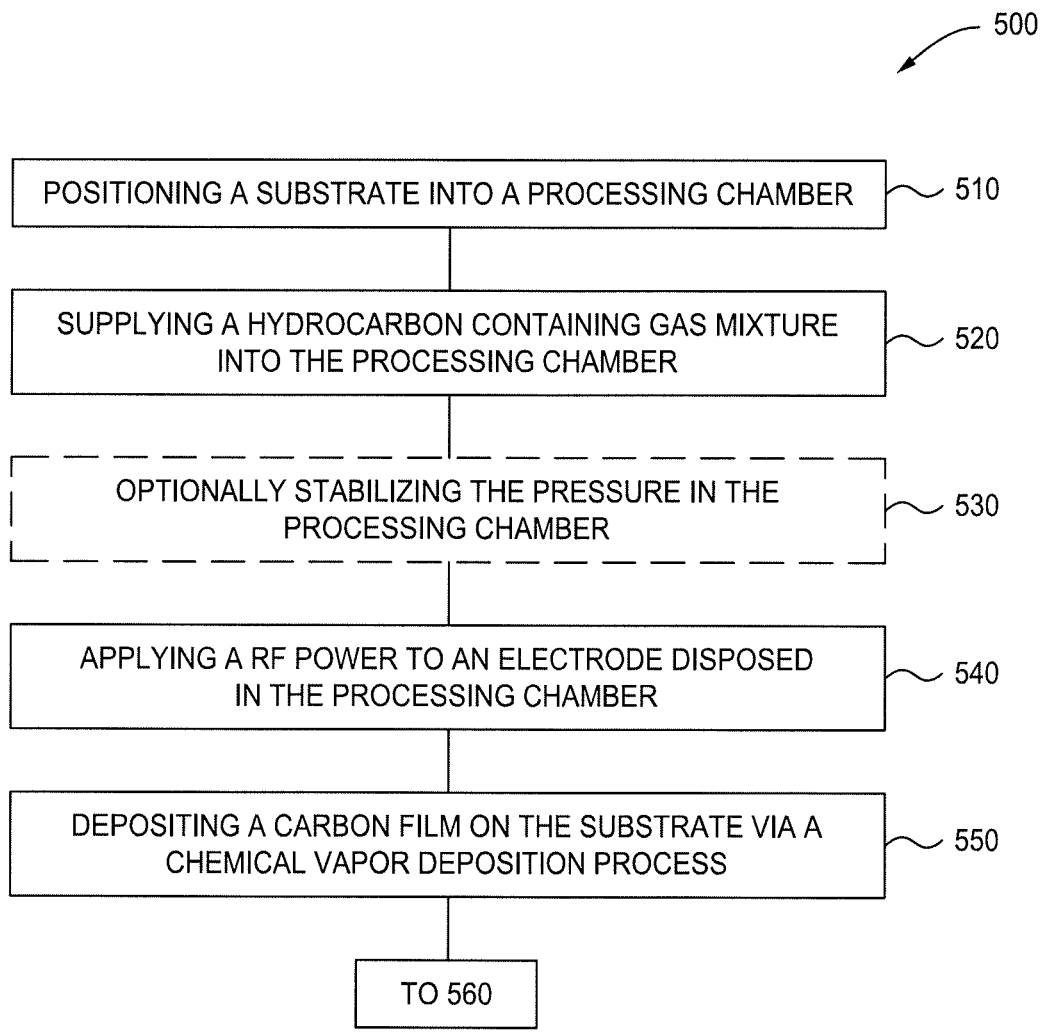
FIGS. 5A-5B depict a flow process diagram of one implementation of a method for forming a carbon hardmask film according to implementations described herein.
Figure 5B:
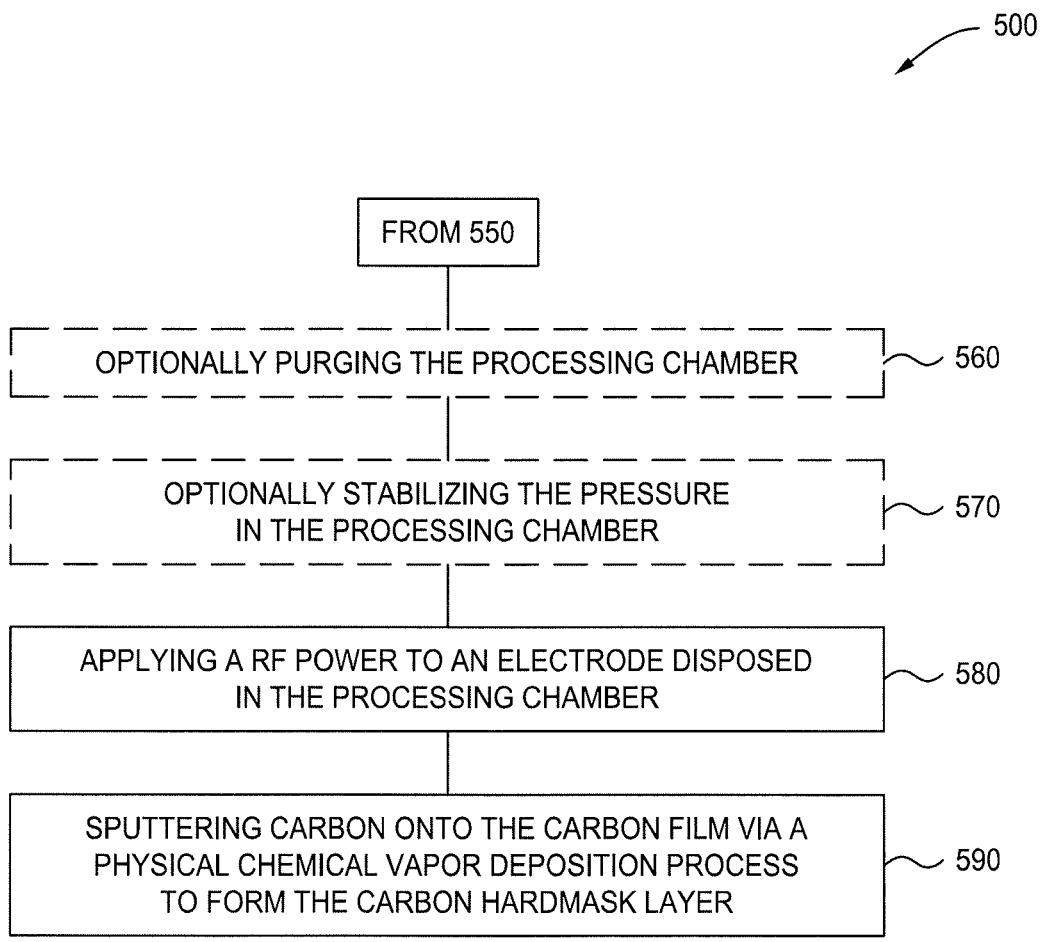
Figure 6A:
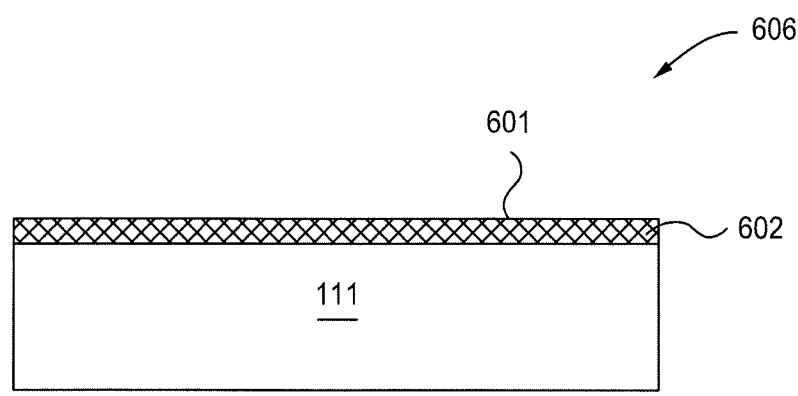
FIGS. 6A-6C depict a sequence of schematic cross-sectional views of a substrate structure incorporating a carbon hardmask film formed on a substrate according to the method of FIGS. 5A-5B.
Figure 6B:
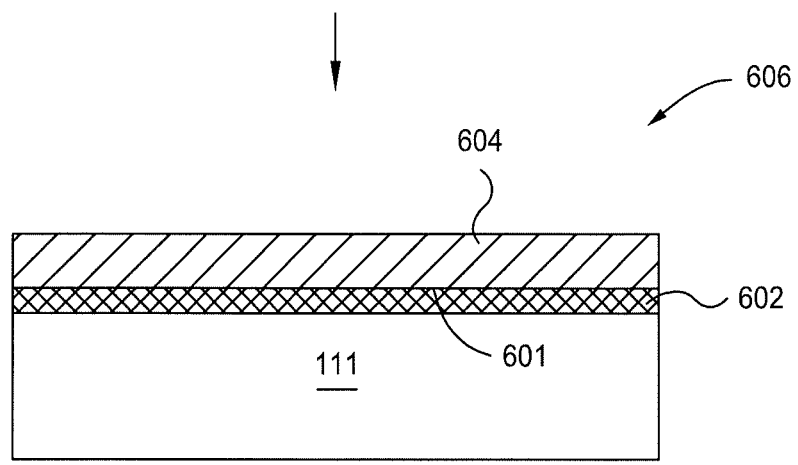
Figure 6C:
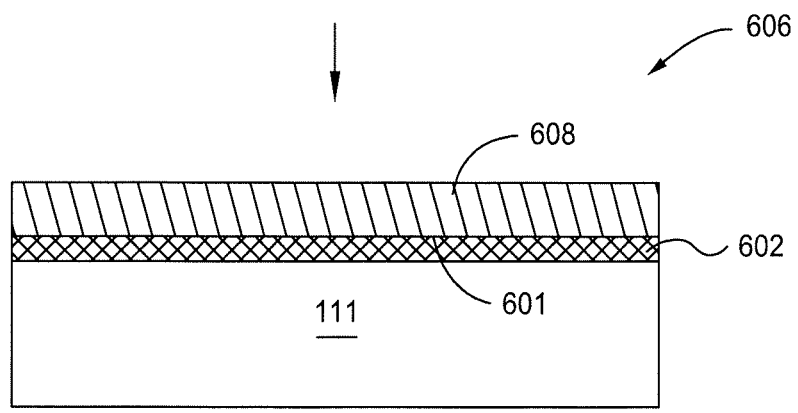

FIGS. 5A-5B depict a flow process diagram of one implementation of a method 500 for forming a high-density carbon hardmask film according to implementations described herein. FIGS. 6A-6C depict a sequence of schematic cross-sectional views of a substrate structure 606 incorporating a high-density carbon film used as a carbon hardmask layer 608 and formed on a substrate according to the method of FIGS. 5A-5B.

The method 500 begins at operation 510 by providing a substrate 111 having a material layer 602 disposed thereon, as shown in FIG. 6A, into a processing chamber, such as the electron beam plasma processing chamber 100 depicted in FIG. 1 or 2. The substrate 111 may have a substantially planar surface, an uneven surface, or a structure formed thereon. In one implementation, the material layer 602 may be a part of a film stack utilized to form a gate structure, a contact structure, an interconnection structure or shallow trench isolation (STI) structure in the front end or back end processes for logic or memory devices, such as NAND structures. In implementations where the material layer 602 is not present, the method 500 may be performed directly on the substrate 111.

In one implementation, the material layer 602 may be a film stack including repeating layers of silicon oxide and/or silicon nitride layers utilized to form a gate structure for NAND structures. Alternatively, the material layer 602 may be a silicon material utilized to form a gate electrode. In yet another implementation, the material layer 602 may include a silicon oxide layer or a silicon oxide layer deposited over a silicon layer. In yet another implementation, the material layer 602 may include one or more layers of other dielectric materials utilized to fabricate semiconductor devices. Suitable examples of the dielectric layers include silicon oxide, silicon nitride, silicon oxynitride, silicon carbide, or any suitable low-k or porous dielectric material as needed. In still another implementation, the material layer 602 does not include any metal layers.

At operation 520, a hydrocarbon-containing gas mixture is supplied into the processing chamber 100 in preparation for forming a carbon film 604 on the substrate 111 via a chemical vapor deposition ("CVD") process, as shown in FIG. 6B. The carbon film 604 may be a high-density carbon film. In one implementation, the hydrocarbon-containing gas mixture may be supplied from the process gas supplies 138 through the array of valves 140 to the gas injectors 130, 134 respectively flowing into the processing chamber 100. In another implementation, the hydrocarbon-containing gas mixture may be supplied from the process gas supplies 114 flowing into the electrode 108.

The hydrocarbon-containing gas mixture includes at least a hydrocarbon compound and an inert gas. In one implementation, the hydrocarbon compound has a formula $C_xH_y$, where x has a range between 1 and 12 and y has a range of between 4 and 26. More specifically, aliphatic hydrocarbons include, for example, alkanes such as methane ($CH_4$), ethane ($C_2H_6$), propane ($C_3H_8$), butane ($C_4H_{10}$), pentane ($C_6H_{12}$), hexane ($C_6H_{14}$), heptane, octane, nonane, decane and the like; alkenes such as propene, ethylene, propylene ($C_3H_6$), butylene ($C_4H_8$), pentene, and the like; dienes such as hexadiene butadiene, isoprene, pentadiene and the like; and alkynes such as acetylene, vinylacetylene and the like. Acyclic hydrocarbons include, for example, cyclopropane, cyclobutane, cyclopentane, cyclopentadiene, toluene and the like. Aromatic hydrocarbons include, for example, benzene, styrene, toluene, xylene, pyridine, ethylbenzene, acetophenone, methyl benzoate, phenyl acetate, phenol, cresol, furan, and the like. Additionally, alpha-terpinene, cymene, 1,1,3, 3,-tetramethylbutylbenzene, t-butylether, t-butylethylene, methyl-methacrylate, and t-butylfurfurylether may be utilized. Additionally, alpha-terpinene, cymene, 1,1,3,3,-tetramethylbutylbenzene, t-butylether, t-butylethylene, methyl-methacrylate, and t-butylfurfurylether may be selected. In one example, the hydrocarbon compounds are propene, acetylene, ethylene, propylene, butylenes, toluene, and alpha-terpinene. In another example, the hydrocarbon compound is selected from $C_2H_2$, $C_3H_6$, $CH_4$, $C_4H_8$, 1,3-dimethyladamantane, bicyclo[2.2.1]hepta-2,5-diene (2,5-Norbornadiene), adamantine ($C_{10}H_{16}$), norbornene ($C_7H_{10}$), or combinations thereof.

Alternatively, one or more additional hydrocarbon compounds may be mixed with the hydrocarbon compound present in the gas mixture supplied to the process chamber. A mixture of two or more hydrocarbon compounds may be used to deposit the carbon film 604.

In a particular implementation, the hydrocarbon compound includes methane ($CH_4$). In another implementation, the hydrocarbon compound includes methane ($CH_4$) and at least one of propene ($C_3H_6$), acetylene ($C_2H_2$) or ethylene ($C_2H_4$).

The inert gas, such as argon (Ar) or helium (He), is supplied with the gas mixture into the processing chamber 100. Other carrier gases, such as nitrogen ($N_2$), oxygen gas ($O_2$), carbon oxide (CO), nitric oxide (NO), hydrogen ($H_2$), ammonia ($NH_3$), a mixture of hydrogen ($H_2$) and nitrogen ($N_2$), or combinations thereof may also be used to control the density and deposition rate of the carbon film 604, as necessary. The addition of hydrogen or nitrogen may be used to control the hydrogen ratio (e.g., carbon to hydrogen ratio) of the deposited carbon film 604. The hydrogen ratio present in the carbon film 604 provides control over layer properties, such as reflectivity, transparency and density.

In one implementation, an inert gas, such as argon (Ar) or helium (He) gas, is supplied with the hydrocarbon compound, such as methane ($CH_4$), into the process chamber to deposit the carbon film 604. The inert gas provided in the gas mixture may assist control of the optical and mechanical properties of the as-deposited layer, such as the index of refraction (n) and the absorption coefficient (k), hardness, density and elastic modulus of the high-density carbon film 604.

In one implementation, the hydrocarbon compound, such as methane ($CH_4$), may be supplied in the gas mixture at a rate between about 50 sccm and about 1000 sccm. The inert gas, such as Ar or He gas, may be supplied in the gas mixture at a rate between about 10 sccm and about 1000 sccm. A hydrogen gas ($H_2$) may be supplied in the gas mixture at a rate between about 100 sccm and about 500 sccm. An oxygen gas ($O_2$) may be supplied in the gas mixture at a rate between about 0 sccm and about 200 sccm. A nitrogen gas ($N_2$) may be supplied in the gas mixture at a rate between about 0 sccm and about 400 sccm. In addition, at least one of the propene ($C_3H_6$), acetylene ($C_2H_2$) or ethylene ($C_2H_4$) may be supplied into the gas mixture at a flow rate at between about 100 sccm and about 2000 sccm.

In one example, adjustable flow ratio and species may be controlled and supplied from different locations, such as upper or lower gas injectors 130, 134, electrode 108, to the processing chamber 100 to maximize radical dissociation and plasma density below or above the grid filter 104. For example, if a higher plasma density is desired in the upper chamber region 100a to increase beam electron flux, an inert gas, such as Ar or He, may be supplied through the upper gas injector 130, which may promote electrode bombardment and reduce molecular gas density near the electrode 108 to increase local plasma density and beam electron flux. In contrast, when dissociation of hydrogen molecules is desired (e.g., increasing resultant film purity), a hydrogen-containing gas may be supplied through the upper gas injector 130 to lower local plasma density while promoting hydrogen radical formation to drive out impurities in the processing chamber as well as in the resultant carbon film 604.

Optionally, at operation 530, the pressure in the processing chamber is stabilized for a predefined RF-on delay time period similarly to operation 330. Any suitable fixed time delay may be used to achieve desired conditions. The process of operation 530 may be performed simultaneously, sequentially or may partially overlap with the processes of operation 520 and operation 540. In one implementation, the pressure is stabilized to a pressure from about 0.1 mTorr to about 5 Torr.

In such an implementation, the hydrocarbon-containing gas mixture may be introduced into the processing chamber 100 for a longer time such as between about 5 seconds and about 30 seconds, for example about 15 seconds, which may vary depending upon the size of the substrate. The flowing of the hydrocarbon-containing gas mixture prior to striking plasma is believed to provide continuous thermal and pressure stabilization of the processing chamber 100. In one implementation, the hydrocarbon-containing gas mixture is flowing into the processing chamber 100 for about 0.5 seconds to about 5 seconds, for example about 1 second to about 2 seconds (the flowing time may vary as long as the flow is long enough for the hydrocarbon-containing gas mixture to start reaching the processing chamber 100) prior to striking the RF plasma in operation 540.

At operation 540, after the hydrocarbon-containing gas mixture is supplied into the processing chamber, RF power is supplied to at least one of the upper electrode (e.g., electrode 108), the lower electrode (e.g., workpiece electrode 196), and/or the inductive coil antenna (e.g., the inductive coil antenna 172). Operation 540 may be performed using any of the power schemes described in relation to operation 340. At operation 540, after the gas mixture is supplied into the processing chamber, a first RF source power may be generated from the RF source power generators 120, 122, and applied to the electrode 108, to generate plasma and secondary electron beams. Secondary electron beams from the electrode 108 may generate cold plasma, such as a temperature less than 100 degrees Celsius that irradiates a surface 601 of the material layer 602 to form the carbon film 604 thereon. Additionally, a second optional RF power may also be applied to the inductive coil antenna 172 through the RF source power generator 174 to add inductively coupled power. The inductively coupled power as generated may increase the radical flux to the substrate and increases the ion flux incident (or beam flux) on the electrons in the upper chamber region 100a to produce a high density of beam electrons. Inductively coupled power also lowers the sheath voltage on the electrode 108, thus reducing beam energy. Furthermore, a third optional RF power may be applied to the workpiece electrode 196 to optimize ion fluxes and energy incident onto the substrate. The third RF power may be generated by the RF power generators 146, 148 and/or additional RF bias power generator 142.

In some implementations where the first RF source power is used, the first RF source power generated from at least one of the RF source power generators 120, 120a, 120b, 122 is applied to the electrode 108 and controlled at a range of between 1 Kilowatts and about 10 Kilowatts. It is noted that the frequency of the RF source power generators 120, 120a, 120b, 122 may be between 0.4 MHz and about 300 MHz. In some implementations where the second RF source power is used, the second RF source power (e.g., an inductively coupled power) is generated from the RF source power generator 174 to be applied to the inductive coil antenna 172 and is typically controlled at between about 1 Kilowatt and about 10 Kilowatts. The frequency of the inductively coupled power applied to the inductive coil antenna 172 may be between 2 MHz and about 13 MHz. In implementations where the lower electrode is powered, the driven frequencies may include a low frequency component, a high frequency component, or a mixture of both low frequency and high frequency components. For example, an RF bias power generated from the RF bias power generator 142 is applied to the workpiece electrode 196 and controlled at a range of between 1 Kilowatt and about 10 Kilowatts. It is noted that the frequency of the RF bias power generator 142 may be between 0.4 MHz and about 300 MHz. In one implementation, multiple frequencies are applied to the workpiece electrode 196 (e.g., 2 MHz from a low frequency RF power generator and 40 MHz from a VHF power generator).

A process pressure, for example between 20 mTorr and about 20 Torr, may also be utilized to form the carbon film 604. It is believed that the electron beam plasma along with the secondary electron beams utilized during the deposition process may provide higher ion bombardment that may enhance dissociation of the ions and energy of the electron beams from the gas mixture, to form the carbon film 604 with a robust film structure.

During deposition, the substrate temperature may be controlled in a range from about room temperature (e.g., 20 degrees Celsius) to about 1000 degrees Celsius. The spacing between the substrate and showerhead may be controlled in a range from about 200 mils to about 15000 mils (e.g., about 200 mils to about 1000 mils).

As discussed above, the electron beam plasma and the secondary electron beam provided from the electrode 108 are accelerated by the electrode sheath, thus acquiring further energy when entering the bulk plasma. These accelerated electrons provide sufficient high energy to efficiently dissociate hydrogen from the molecules, producing enough hydrogen radicals to extract hydrogen impurities from the carbon films, such as the carbon film 604 formed on the substrate 111, thus forming the carbon film 604 with high purity. The accelerated secondary beam electrons create low temperature plasma, so called cold plasma, above the substrate 111 (at the lower chamber region 100b under the grid filter 104). Low electron temperature plasma often has low electron energy less than 1 eV, such as less than 0.5 eV. Thus, low energy electron from the cold plasma is generated sufficiently to efficiently dissociate hydrogen molecules in vibrational states and produce hydrogen radicals, to increase the hydrogen radical flux onto the substrate surface.

Furthermore, as the accelerated secondary electron beam emitted from the electrode 108 reaches the substrate surface, the high energy carried from the accelerated secondary electron beam, e.g., in the order of hundreds of electron volts (eV) to thousands of electron volts (eV), may induce surface reaction, such as exciting carbon sp3 surface state to form the high-density carbon film 604 on the substrate 111 as well and breaking weak (or undesired) carbon sp or sp2 bonds or even C—H bonds, thus increasing sp3 bonding which may promote formation of a diamond like carbon layer, rather than amorphous state or other carbon structures. The carbon elements bonded in the carbon film 604 may mostly form in sp3 carbons with four single bonds pointing towards the corner of a tetrahedron bonding with other carbon elements. Undesired sp2 hybridized carbons with two single and one double bond, e.g., the three bonds pointing towards the corners of a triangle, often results in the film structure becoming an amorphous state, rather than desired diamond like structures. The amount of hydrogen termination bonds and the extents of any missing or dangling carbon bonds included in the sp3 hybridized carbons or sp2 hybridized carbons affect how tightly these carbon atoms are networked and packed, thus determining film density and stress. The carbon film 604 is configured to form with complete sp3 hybridization and zero hydrogen content when all carbon atoms are fully interconnected. In one example, the accelerated secondary electron beam may have a beam energy greater than 100 eV.

At operation 550, after the deposition process is performed by the process parameters regulated at operation 540, the carbon film 604 is then formed on the substrate 111. The as deposited carbon film 604 may have a thickness between about 10 nanometers and about 100 nanometers.

Optionally, after operation 550 is completed, an optional chamber purge process may be performed at operation 560 to remove any remaining gases and by-products from the chamber from the carbon film 604 formation process. During the chamber purge process, a purge gas (e.g., an inert gas such as argon or nitrogen) may be delivered into the processing chamber 100 from at least one of the electrode 108, the upper gas injector 130, and the lower gas injector 134. In one implementation, the flow of the hydrocarbon-containing gas used during operation 540 is stopped while the inert gas used during operation 540 continues to flow and functions as the purge gas. Pressure within the processing chamber 100 may be controlled using a valve system, which controls the rate at which the exhaust gases are drawn from the chamber.

In some implementations, after operation 550 is completed, an oxygen plasma cleaning process similar to the oxygen plasma cleaning process previously described is performed between the CVD and the PVD process to remove any film deposited on the surface of the upper electrode during the CVD process. In doing so, the carbon surface of the electrode 108 is cleaned prior to beginning the PVD process.

At operation 570, the pressure in the processing chamber is stabilized for a predefined RF-on delay time period similarly to operation 330. Any suitable fixed time delay may be used to achieve desired conditions. The process of operation 530 may be performed simultaneously, sequentially or may partially overlap with the processes of operation 520 and operation 540. In one implementation, the pressure is stabilized to a pressure from about 0.1 mTorr to about 5 Torr.

The predefined RF-on delay time period is a fixed time delay defined as the time period between performing the CVD process and striking or generating the plasma at operation 580. Any suitable fixed time delay may be used to achieve desired pressure conditions. The length of the RF-on delay time period is typically selected such that the pressure within the processing chamber is stabilized to a desired pressure for the physical chemical vapor deposition process. The process of operation 570 may be performed simultaneously, sequentially or may partially overlap with the processes of operation 560 and operation 580. In one implementation, the pressure is stabilized to a pressure from about 0.1 mTorr to about 50 mTorr (e.g., between about 1 mTorr and about 10 mTorr). Typically, the PVD process pressure is extremely low to maximize ion energy.

After the desired CVD deposition time, at operation 580, RF power is applied to the upper electrode (e.g., electrode 108) while flowing an inert gas into the processing chamber. The inert gas may be the same inert gas used during the CVD deposition process or the inert gas may be a different inert gas. In some implementations, the hydrocarbon gases used during the CVD process are stopped while continuing to flow the inert gas into the chamber. RF power is applied to at least the upper electrode during the PVD process of operation 580 and operation 590. The upper electrode can be powered by multiple RF frequency sources to maximize the sputtering yield. In some implementations, RF power is also applied to the lower electrode (e.g., workpiece electrode 196) during the PVD process. The lower electrode can be powered to introduce moderate ion bombardment to densify the film and crosslink the PVD and CVD layers. In some implementations, a magnetic field can be used to further enhance plasma density at low pressure thus increasing the sputtering rate of the carbon. For example, a magnetic field may be applied by magnet 160-1 and magnet 160-2. The magnetic field may have a magnetic strength being less than or equal to 1,000 Gauss (e.g., from about 20 Gauss to about 700 Gauss; or from about 100 Gauss to about 500 Gauss).

In one example, only the upper electrode (e.g., electrode 108) is powered during the PVD process of operation 580. For example, a first RF source power generated from at least one of the RF source power generators 120, 120a, 120b, 122 is applied to the electrode 108 and controlled at a range of between 1 Kilowatts and about 10 Kilowatts. It is noted that the frequency of the RF source power generators 120, 120a, 120b, 122 may be between 0.4 MHz and about 300 MHz. In this example, power is only applied to the upper electrode (e.g., power is not applied to either the lower electrode (e.g., workpiece electrode 196) or the inductive coil antenna (e.g., the inductive coil antenna 172)). In one implementation, the frequency applied to the upper electrode is between 0.4 MHz and about 300 MHz. In one implementation, a high frequency (e.g., between about 11 MHZ and 60 MHz) is applied to the upper electrode. In one implementation, a low frequency (e.g., between about 0.4 kHz and 10 MHz) is applied to the upper electrode (e.g., electrode 108). In one implementation, multiple frequencies are applied to the upper electrode (e.g., 2 MHz from low frequency RF source power generator 122 and 40 MHz from VHF power generator 120a).

In yet another example, both the upper electrode (e.g., electrode 108) and the lower electrode (e.g., workpiece electrode 196) are powered simultaneously during operation 580 using any of the conditions previously described. For example, an RF source power generated from at least one of the RF source power generators 120, 120a, 120b, 122 is applied to the upper electrode and controlled in a range from about 1 Kilowatt to about 10 Kilowatts and a second RF power (bias or source) is applied to the workpiece electrode 196 and controlled in a range from about 1 Kilowatt to about 10 Kilowatts. In this example, power is applied to both the electrode 108 and the workpiece electrode 196 (e.g., power is not applied to the inductive coil antenna (e.g., inductive coil antenna 172)). In one implementation, the frequency applied to the electrode 108 is between about 0.4 MHz and about 300 MHz and the frequency applied to the workpiece electrode 196 is between about 0.4 MHz and about 300 MHz. In one implementation, multiple frequencies are applied to the electrode 108 and/or the workpiece electrode 196 (e.g., 2 MHz from a low frequency RF power generator and 40 MHz from a VHF power generator).

At operation 590, after the deposition process is performed by the process parameters regulated at operation 580, carbon is sputtered onto the high-density carbon film 604 to form a carbon hardmask layer 608 on the substrate 111 as shown in FIG. 6C. The carbon hardmask layer 608 may be a high-density carbon hardmask layer 608. The as deposited carbon hardmask layer 608 may have a thickness between about 10 nanometers and about 100 nanometers. The CVD process (e.g., operations 520-550) and the PVD process (e.g., operations 560-590) may be iteratively run until desired thickness of the high-density hardmask film is deposited. In addition, although the sequence of deposition is described as CVD followed by PVD, CVD followed by PVD can also be used.

In another implementation, the PVD and CVD processes are performed simultaneously. In this implementation, the CVD film could deposit on the carbon target surface on the top electrode as well, thus hindering the sputtering process. In some implementations, an inert purge gas flows either through the top electrode or is peripherally injected into the upper portion of the chamber (e.g., upper chamber region 100a), and carbon source gases are injected into the lower portion of the chamber (lower chamber region 100b). In doing so, the back diffusion of carbon source gases to the top electrode is minimized, thus reducing carbon film deposition on the top electrode surface.

In one implementation, the carbon film 604 as formed herein is configured to have a density greater than or equal to 2.0 g/cc (e.g., between about 2.0 g/cc to about 2.5 g/cc. In one implementation, the carbon film 604 has a stress of 500 MPa or less. In one implementation, the absorption coefficient (k) of the carbon film 604 may be controlled at less than 0.4 (e.g., less than 0.1) such as between about 0.1 and about 0.3 at a wavelength about 633 nm. The carbon film 604 may have a thickness between about 10 nm and about 2,000 nm (e.g., between about 100 nm and about 300 nm, between about 500 and about 1,000 nm; or between about 1,000 nm and about 2,000 nm).

In some implementations, the temperature of the workpiece support pedestal 110 on which the substrate 111 is positioned may be used to control the stress of the deposited carbon film. It has been found by the inventors that the temperature of the support pedestal has an impact on film stress and can be utilized to decrease film stress. For example, given a specific power/pressure/gas combination, the film stress when the temperature of the support pedestal is 60 degrees Celsius the stress of the deposited carbon film is about −800 MPa. However, when the temperature of the support pedestal is lowered to 10 degrees Celsius the stress of the deposited film is lowered to about −600 MPa. In addition, flowing helium between the workpiece support surface 110a of the support surface and the backside surface of the substrate 111 can be used to modulate film stress. In one implementation, the helium is run at a pressure in a range from about 15 Torr to about 30 Torr and the temperature of the support pedestal is set to a range from about 20 degrees Celsius to about 700 degrees Celsius.

The method 300 and the method 500 are useful for processes used in the front-end-of-line process (FEOL) prior to metallization process in a semiconductor device manufacturing process. The transparent carbon layer formed by method 300 and the high-density carbon layer formed by method 500 may serve as a hardmask layer during an etching process due to their high etching selectivity. Suitable processes include gate manufacturing applications, contact structure applications, shallow trench isolation (STI) process, and the like. In some implementations, where the high-density carbon film is used as an etch stop layer or used as different films for different process purposes, the mechanical or optical properties of the high-density carbon film may be adjusted as well to meet the particular process need.

Thus, methods for forming a high-density carbon layer and/or a transparent carbon layer having both desired density and optical film properties with low stress are provided by an electron beam plasma deposition process. The methods advantageously provide a transparent carbon layer and high-density carbon layer with desired mechanical properties, such as low stress and high density as well as high etching selectivity and film transparency. In addition, the high-density carbon layer and the transparent carbon layer may be easily removed from the substrate by an oxygen strip or ashing process. The improved mechanical properties of the high-density carbon layer and the transparent carbon layer provide high film selectivity and quality for the subsequent etching process while maintaining desired range of the film flatness, stress level and film optical properties, such as index of refraction (n) and the absorption coefficient (k), for the subsequent lithography process.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method of forming a transparent carbon layer on a substrate, comprising:
generating an electron beam plasma above a surface of a substrate positioned over a pedestal electrode and disposed in a processing chamber having a showerhead electrode having plural openings, the showerhead positioned above the pedestal electrode, comprising:
flowing a hydrocarbon-containing gas mixture into the processing chamber, wherein the hydrocarbon-containing gas mixture includes a hydrocarbon compound selected from the group consisting of $CH_4$, $C_3H_6$, $C_2H_2$, and $C_2H_4$, and wherein the showerhead electrode has a surface containing a secondary electron emission material selected from a silicon-containing material and a carbon-containing material; and
applying a first RF power to at least the showerhead electrode;
bombarding the showerhead electrode to provide secondary electrons and secondary electron beam flux to the surface of the substrate; and
forming a transparent carbon layer on the surface of the substrate from the hydrocarbon-containing gas mixture, wherein the transparent carbon layer has a k-value less than 0.1, a stress lower than 100 MPa, and a density between 1.5 to 2 g/cc.

2. The method of claim 1, wherein the showerhead electrode functions as a showerhead assembly and the hydrocarbon-containing gas mixture flows through the showerhead assembly and into the processing chamber.

3. The method of claim 1, wherein the first RF power is a first RF source power applied to the showerhead electrode and comprises a low frequency RF power between about 0.4 kHz and about 10 MHz.

4. The method of claim 3, wherein applying the first RF power further comprises applying a second RF source power to the showerhead electrode, the second RF source power comprising a high frequency RF power between about 11 MHz and 60 MHz.

5. The method of claim 1, wherein applying the first RF power further comprises applying a second RF power to an antenna coil disposed adjacent to the processing chamber.

6. The method of claim 5, wherein the first RF power applied to the showerhead electrode comprises a low frequency RF power between about 0.4 kHz and about 10 MHz.

7. The method of claim 5, wherein applying the first RF power further comprises applying a third RF power to the showerhead electrode comprising a low power frequency between about 0.4 MHz and about 13 MHz.

8. A method of forming a transparent carbon layer on a substrate, comprising:
applying a first RF power to a carbon-containing showerhead electrode having plural openings, the showerhead disposed in a processing chamber;
bombarding the carbon-containing showerhead electrode to generate a secondary electron beam in a gas mixture containing a hydrocarbon-containing gas above a surface of a substrate positioned over a pedestal electrode and disposed in the processing chamber; and
forming a transparent carbon layer on the surface of the substrate from the hydrocarbon-containing gas of the gas mixture,
wherein the transparent carbon layer has a k-value less than 0.1, a stress lower than 100 MPa, and a density between 1.5 to 2 g/cc, and
wherein the hydrocarbon-containing gas includes a hydrocarbon compound selected from the group consisting of $CH_4$, $C_3H_6$, $C_2H_2$, and $C_2H_4$.

9. The method of claim 8, wherein the first RF power is a first RF source power applied to the carbon-containing showerhead electrode and comprises a low frequency RF power between about 0.4 kHz and about 10 MHz.

10. The method of claim 9, further comprising applying a second RF source power to the carbon-containing showerhead electrode, the second RF source power comprising a high frequency RF power between about 11 MHz and 60 MHz.

11. The method of claim 8, wherein applying the first RF power further comprises applying a second RF power to an antenna coil disposed adjacent to the processing chamber.

12. The method of claim 11, wherein the first RF power applied to the carbon-containing showerhead electrode comprises a low frequency RF power between about 0.4 kHz and about 10 MHz.

13. The method of claim 11, wherein applying the first RF power further comprises applying a third RF power to the carbon-containing showerhead electrode comprising a low frequency power between about 0.4 MHz and about 13 MHz.

14. A method of forming a transparent carbon layer on a substrate, comprising:
positioning a substrate over a pedestal electrode positioned in a processing region of a processing chamber, the processing chamber further comprising a showerhead electrode having plural openings, the showerhead positioned above the pedestal electrode in the processing region, wherein the showerhead electrode has a surface containing a secondary electron emission material selected from a silicon-containing material and a carbon-containing material;
flowing a hydrocarbon-containing gas mixture into the processing region of the processing chamber, wherein the hydrocarbon-containing gas mixture consists of: a hydrocarbon compound selected from the group consisting of $CH_4$, $C_3H_6$, $C_2H_2$, and $C_2H_4$ and optionally an inert gas;
generating an electron beam plasma above a surface of the substrate, comprising:
applying a first RF power to at least the showerhead electrode; and
bombarding the showerhead electrode to provide secondary electrons and secondary electron beam flux to the surface of the substrate; and
forming a transparent carbon layer on the surface of the substrate from the hydrocarbon-containing gas mixture, wherein the transparent carbon layer has a k-value less than 0.1, a stress lower than 100 MPa, and a density between 1.5 to 2 g/cc.

15. The method of claim 14, wherein the first RF power is a first RF source power applied to the showerhead electrode and comprises a low frequency RF power between about 0.4 kHz and about 10 MHz.

16. The method of claim 15, further comprising applying a second RF source power to the showerhead electrode, the second RF source power comprising a high frequency RF power between about 11 MHz and 60 MHz.

17. The method of claim 14, wherein applying the first RF power further comprises applying a second RF power to an antenna coil disposed adjacent to the processing chamber.

18. The method of claim 17, wherein the first RF power applied to the showerhead electrode comprises a low frequency RF power between about 0.4 kHz and about 10 MHz.

19. The method of claim 17, wherein applying the first RF power further comprises applying a third RF power to the showerhead electrode comprising a low frequency power between about 0.4 MHz and about 13 MHz.

* * * * *

UNITED STATES PATENT AND TRADEMARK OFFICE
CERTIFICATE OF CORRECTION

PATENT NO. : 11,043,375 B2
APPLICATION NO. : 16/055974
DATED : June 22, 2021
INVENTOR(S) : Yang Yang et al.

It is certified that error appears in the above-identified patent and that said Letters Patent is hereby corrected as shown below:

On the Title Page

In item (56), in Column 2, under "Other Publications", Line 2, delete "diamnd" and insert -- diamond --, therefor.

In the Specification

In Column 5, Line 25, delete "$C_2$," and insert -- $O_2$, --, therefor.

In Column 12, Line 14, delete "$(O_{10}H_{16})$," and insert -- $(C_{10}H_{16})$, --, therefor.

In Column 18, Line 41, delete "$C_2$, $C_3$," and insert -- $O_2$, $O_3$, --, therefor.

In Column 19, Line 56, delete "$(C_6H_{12})$," and insert -- $(C_5H_{12})$, --, therefor.

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*